United States Patent
Makihara et al.

(10) Patent No.: US 9,465,083 B2
(45) Date of Patent: Oct. 11, 2016

(54) VOLTAGE DETECTING DEVICE FOR ASSEMBLED BATTERY

(71) Applicant: DENSO CORPORATION, Kariya, Aichi-pref. (JP)

(72) Inventors: Tetsuya Makihara, Nukata-gun (JP); Kazutaka Honda, Chiryu (JP); Kazunori Nagaya, Kasugai (JP)

(73) Assignee: DENSO CORPORATION, Kariya (JP)

( * ) Notice: Subject to any disclaimer, the term of this patent is extended or adjusted under 35 U.S.C. 154(b) by 369 days.

(21) Appl. No.: 14/132,197

(22) Filed: Dec. 18, 2013

(65) Prior Publication Data
US 2014/0176148 A1 Jun. 26, 2014

(30) Foreign Application Priority Data

Dec. 26, 2012 (JP) .................................. 2012-282517
Oct. 23, 2013 (JP) .................................. 2013-220111

(51) Int. Cl.
*G01R 31/36* (2006.01)
*H02J 7/00* (2006.01)

(52) U.S. Cl.
CPC ....... *G01R 31/3658* (2013.01); *G01R 31/3637* (2013.01); *H02J 7/0013* (2013.01); *H02J 7/0021* (2013.01)

(58) Field of Classification Search
CPC .......... G01R 31/3658; G01R 31/3637; H02J 7/0021; H02J 7/0013
USPC .......... 324/433, 434; 320/116, 119, 121, 107
See application file for complete search history.

(56) References Cited

U.S. PATENT DOCUMENTS

| 6,437,538 B1 | 8/2002 | Tsurumi et al. |
| 7,663,375 B2 * | 2/2010 | Yonezawa ........ G01R 19/16542 320/116 |
| 8,692,556 B2 * | 4/2014 | Makihara ............. G01R 31/362 320/116 |
| 2001/0011910 A1 | 8/2001 | Tanaka et al. |

(Continued)

FOREIGN PATENT DOCUMENTS

| JP | 2-011015 A | 1/1990 |
| JP | 7-109977 B2 | 11/1995 |

(Continued)

OTHER PUBLICATIONS

Atmel Corporation, Li-Ion, NiMH Battery Measuring, Charge Balancing and Power-supply Circuit, ATA6870 Preliminary, 9116B-AUTO-10/09, 2009.

(Continued)

*Primary Examiner* — Nathaniel Pelton
(74) *Attorney, Agent, or Firm* — Posz Law Group, PLC

(57) ABSTRACT

In a voltage detecting device, a control unit turns on first switches and fifth switches corresponding to a plurality of unit batteries of an assembled battery to charge electric charge to first capacitors. The control unit simultaneously turns off at least one of the first switches or the fifth switches to hold the electric charge in the first capacitors. While selecting one of the unit batteries in a predetermined order as a target unit battery for voltage detection, the control unit temporarily turns off a fourth switch to reset electric charge of a second capacitor, and then turns of second switches and third switches in a state where one of the first switches and one of the fifth switches corresponding to the target unit battery are kept in an off state, thereby to detect a voltage of the target unit battery.

26 Claims, 22 Drawing Sheets

(56) References Cited

U.S. PATENT DOCUMENTS

| | | | |
|---|---|---|---|
| 2002/0070733 A1* | 6/2002 | Takada | G01R 31/3658 324/647 |
| 2002/0118039 A1 | 8/2002 | Tanaka et al. | |
| 2003/0107403 A1 | 6/2003 | Tanaka et al. | |
| 2004/0041587 A1 | 3/2004 | Tanaka et al. | |
| 2005/0122155 A1 | 6/2005 | Tanaka et al. | |
| 2006/0261677 A1* | 11/2006 | Shibuya | H02J 7/0018 307/105 |
| 2006/0273825 A1 | 12/2006 | Tanaka et al. | |
| 2008/0266731 A1 | 10/2008 | Tanaka et al. | |
| 2011/0196632 A1* | 8/2011 | Shimizu | G01R 31/3658 702/63 |
| 2011/0199708 A1 | 8/2011 | Tanaka et al. | |
| 2012/0139545 A1* | 6/2012 | Makihara | G01R 31/3658 324/426 |
| 2012/0154965 A1 | 6/2012 | Tanaka et al. | |

FOREIGN PATENT DOCUMENTS

| | | |
|---|---|---|
| JP | H11-176480 A | 7/1999 |
| JP | 2000-323183 A | 11/2000 |
| JP | 2001-56350 A | 2/2001 |
| JP | 2003-17996 A | 1/2003 |
| JP | 2004-248348 A | 9/2004 |
| JP | 2008-92656 A | 4/2008 |
| JP | 2009-32908 A | 2/2009 |
| JP | 2009-042071 A | 2/2009 |
| JP | 2010-145128 A | 7/2010 |
| JP | 2011-250609 A | 12/2011 |

OTHER PUBLICATIONS

Office Action mailed on Jan. 13, 2015 in corresponding JP application No. 2013-220111 (with English translation).

* cited by examiner

VOLTAGE DETECTING DEVICE FOR ASSEMBLED BATTERY

CROSS REFERENCE TO RELATED APPLICATION

This application is based on Japanese Patent Applications No. 2012-282517 filed on Dec. 26, 2012 and No. 2013-220111 filed on Oct. 23, 2013, the disclosures of which are incorporated herein by reference.

TECHNICAL FIELD

The present disclosure relates to a voltage detecting device for detecting a voltage of each of unit batteries of an assembled battery.

BACKGROUND

An assembled battery is mounted in a hybrid vehicle or an electric vehicle. The assembled battery includes a plurality of rechargeable batteries, as unit batteries, connected in series to each other. In such an assembled battery, it is necessary to detect a voltage of each of the unit batteries so as to protect and manage each of the unit batteries. However, in the assembled battery used for the hybrid vehicle or the electric vehicle, the number of series connection of the unit batteries is very large. Therefore, the potential of the unit batteries increases toward a higher potential position. That is, the unit battery connected at a higher potential position in the assembled battery has a potential higher than the unit battery connected at a lower potential position in the assembled battery. Therefore, a higher voltage is applied to the voltage detecting device of the unit battery.

JP 2012-118003 A, which corresponds to US 2012/0139545 A1, discloses a voltage detecting device for an assembled battery. In the voltage detecting device of JP 2012-118003 A, an operation amplifier and a switch are provided by a low withstand voltage transistor, without using a high withstand voltage transistor. The voltage detecting device includes a first capacitor for each of the unit batteries. A first switch is disposed between a first end of the first capacitor and a high potential terminal of the unit battery, and a second switch is disposed between the first end of the first capacitor and a low potential terminal of the unit battery. A third switch is disposed between a second end of the first capacitor and an inverted input terminal of the operation amplifier. A second capacitor and a fourth switch are connected in parallel with each other, between an input terminal of the operation amplifier and an output terminal of the operation amplifier.

In the voltage detecting device, one of a plurality of unit batteries is selected as a target of voltage detection in a predetermined order. The first switch, the third switch and the fourth are turned on to accumulate electric charge of the unit battery selected as the voltage detection target in the first capacitor. Thereafter, the first switch and the fourth switch are turned off and the second switch is turned on to detect the voltage of the selected unit battery.

SUMMARY

When the unit battery deteriorates, for example, an internal resistance increases and a terminal open circuit voltage (electromotive force) reduces. Therefore, a management device for the assembled battery needs to simultaneously detect the voltage of each of the unit batteries and a current flowing in the entirety of the assembled battery so as to measure the internal resistance and the terminal open circuit voltage of each of the unit batteries at high accuracy.

In the voltage detecting device disclosed in JP 2012-118003 A, the unit batteries are selected as the voltage detection target in a sequence order. The electric charge according to the voltage of the selected unit battery is held in the first capacitor for sampling the voltage, thereby detecting the battery voltage.

When this voltage detecting device is used to measure the internal resistance and the terminal open circuit voltage, it is necessary to sample the voltage each time the unit battery is selected as the voltage detection target. Also, it is necessary to detect the current flowing in the assembled battery each time the voltage of the unit battery is sampled. Therefore, the sampling time and the number of times of detecting the current increase. As a result, the time of measuring the internal resistance and the time of measuring the terminal open circuit voltage of the unit batteries increase.

It is an object of the present disclosure to provide an assembled battery that detects voltages of a plurality of unit batteries while simultaneously sampling the plurality of unit batteries.

According to a first aspect of the present disclosure, a voltage detecting device is configured to detect a voltage of each of a plurality of unit batteries of an assembled battery. The plurality of unit batteries is connected in series. The voltage detecting device includes an operation amplifier, a plurality of first capacitors, a plurality of first switches, a plurality of second switches, a plurality of third switches, a second capacitor, a fourth switch, a plurality of fifth switches, and a control unit. The operation amplifier has an inverted input terminal and a non-inverted input terminal. The first capacitors is correspondingly provided for the unit batteries. Each of the first switches is disposed between a high potential terminal of corresponding one of the unit batteries and a first end of corresponding one of the first capacitors. Each of the second switches is disposed between a low potential terminal of corresponding one of the unit batteries and the first end of corresponding one of the first capacitors. Each of the third switches is disposed between the inverted input terminal of the operation amplifier and a second end of corresponding one of the first capacitors. The second capacitor and the fourth switch are disposed in parallel between the inverted input terminal of the operation amplifier and an output terminal of the operation amplifier. Each of the fifth switches is disposed between a voltage line applied with a specified voltage and the second end of corresponding one of the first capacitors. The control unit controls the first switches, the second switches, the third switches, the fourth switch and the fifth switches to detect the voltage of each of the unit batteries. The control unit closes the first switches and the fifth switches to charge electric charge to the plurality of first capacitors, and simultaneously opens at least one of the first switches or the fifth switches to hold the electric charge in the first capacitors. Then, while selecting one of the unit batteries in a predetermined order as a target unit battery for voltage detection, the control unit temporarily closes the fourth switch to reset electric charge of the second capacitor, and then closes one of the second switches corresponding to the target unit battery and one of the third switches corresponding to the target unit battery, in a state where one of the first switches corresponding to the target unit battery and one of the fifth switches corresponding to the target unit battery are opened, thereby to detect the voltage of the target unit battery.

In the above voltage detecting device, the electric charge of the unit batteries is sampled at the same time, and then the voltages of the unit batteries are detected in a predetermined order using the electric charge sampled. Therefore, the time of measuring the internal resistance and the terminal open circuit voltage of the unit batteries can be shortened, as compared with a conventional structure.

According to a second aspect of the present disclosure, a voltage detecting device is configured to detect a voltage of each of a plurality of unit batteries of an assembled battery. The plurality of unit batteries is connected in series. The voltage detecting device includes an operation amplifier, a plurality of first capacitors, a plurality of first switches, a plurality of second switches, a plurality of third switches, a second capacitor, a fourth switch and a control unit. The operation amplifier has an inverted input terminal and a non-inverted input terminal. The first capacitors are correspondingly provided for the unit batteries. Each of the first switches is disposed between a high potential terminal of corresponding one of the unit batteries and a first end of corresponding one of the first capacitors. Each of the second switches is disposed between a low potential terminal of corresponding one of the unit batteries and the first end of corresponding one of the first capacitors. Each of the third switches is disposed between the inverted input terminal of the operation amplifier and a second end of corresponding one of the first capacitors. The second capacitor and the fourth switch are disposed in parallel between the inverted input terminal of the operation amplifier and an output terminal of the operation amplifier. The control unit controls the first switches, the second switches, the third switches, and the fourth switch to detect the voltage of each of the unit batteries. The control unit closes the first switches and the third switches to charge electric charge to the plurality of first capacitors, in a state where the fourth switch is closed and the operation amplifier is operated in a voltage follower, and then simultaneously opens at least one of the first switches or the third switches to hold the electric charge in the first capacitors. While selecting one of the unit batteries in a predetermined order as a target unit battery for voltage detection, the control unit temporarily closes the fourth switch to reset electric charge of the second capacitor, and closes one of the second switches corresponding to the target unit battery and one of the third switches corresponding to the target unit battery, in a state where one of the first switches corresponding to the target unit battery is opened, thereby to detect the voltage of the target unit battery.

The voltage detecting device according to the second aspect has a similar structure to the voltage detecting device according to the first aspect, but does not include the fifth switches. Also in this case, the similar advantageous effects will be achieved.

According to a third aspect of the present disclosure, a voltage detecting device is configured to detect a voltage of each of a plurality of unit batteries of an assembled battery. The plurality of unit batteries is connected in series. The voltage detecting device includes an operation amplifier, a plurality of first capacitors, a plurality of first switches, a plurality of second switches, a plurality of third switches, a fourth switch, a second capacitor, a ninth switch, a tenth switch and a control unit. The operation amplifier has an inverted input terminal and a non-inverted input terminal. The first capacitors are correspondingly provided for the unit batteries. Each of the first switches is disposed between a high potential terminal of corresponding one of the unit batteries and a first end of corresponding one of the first capacitors. Each of the second switches is disposed between a low potential terminal of corresponding one of the unit batteries and the first end of corresponding one of the first capacitors. Each of the third switches is disposed between the inverted input terminal of the operation amplifier and a second end of corresponding one of the first capacitors. The fourth switch is disposed between the inverted input terminal of the operation amplifier and an output terminal of the operation amplifier. The second capacitor and the ninth switch are disposed in series, between the inverted input terminal of the operation amplifier and the output terminal of the operation amplifier. The tenth switch is disposed between a common connecting point of the second capacitor and the ninth switch and a voltage line applied with a constant voltage. The control unit controls the first switches, the second switches, the third switches, the fourth switch, the ninth switch and the tenth switch to detect the voltage of each of the unit batteries. The control unit closes the first switches and the third switches to charge electric charge to the plurality of first capacitors, in a state where the fourth switch is closed and the operation amplifier is operated in a voltage follower, and then simultaneously opens at least one of the first switches or the third switches to hold the electric charge in the first capacitors. While selecting one of the unit batteries in a predetermined order as a target unit battery for voltage detection, the control unit temporarily closes the fourth switch and the tenth switch to reset electric charge of the second capacitor, and closes the ninth switch, one of the second switches corresponding to the target unit battery, and one of the third switches corresponding to the target unit battery, in a state where one of the first switches corresponding to the target unit battery is opened, thereby to detect the voltage of the target unit battery.

In the voltage detecting device according to the third aspect, the advantageous effects similar to the voltage detecting device according to the second aspect will be achieved. Further, an offset voltage of the operation amplifier can be removed from the detected voltage of the unit battery.

BRIEF DESCRIPTION OF THE DRAWINGS

The above and other objects, features and advantages of the present disclosure will become more apparent from the following detailed description made with reference to the accompanying drawings, in which like parts are designated by like reference numbers and in which.

DETAILED DESCRIPTION

Hereinafter, exemplary embodiments of the present disclosure will be described with reference to the drawings. Like parts will be designated with like reference numbers, and descriptions thereof will not be repeated.

First Embodiment

A first embodiment will be described with reference to FIGS. 1 to 6.

Figure 1:
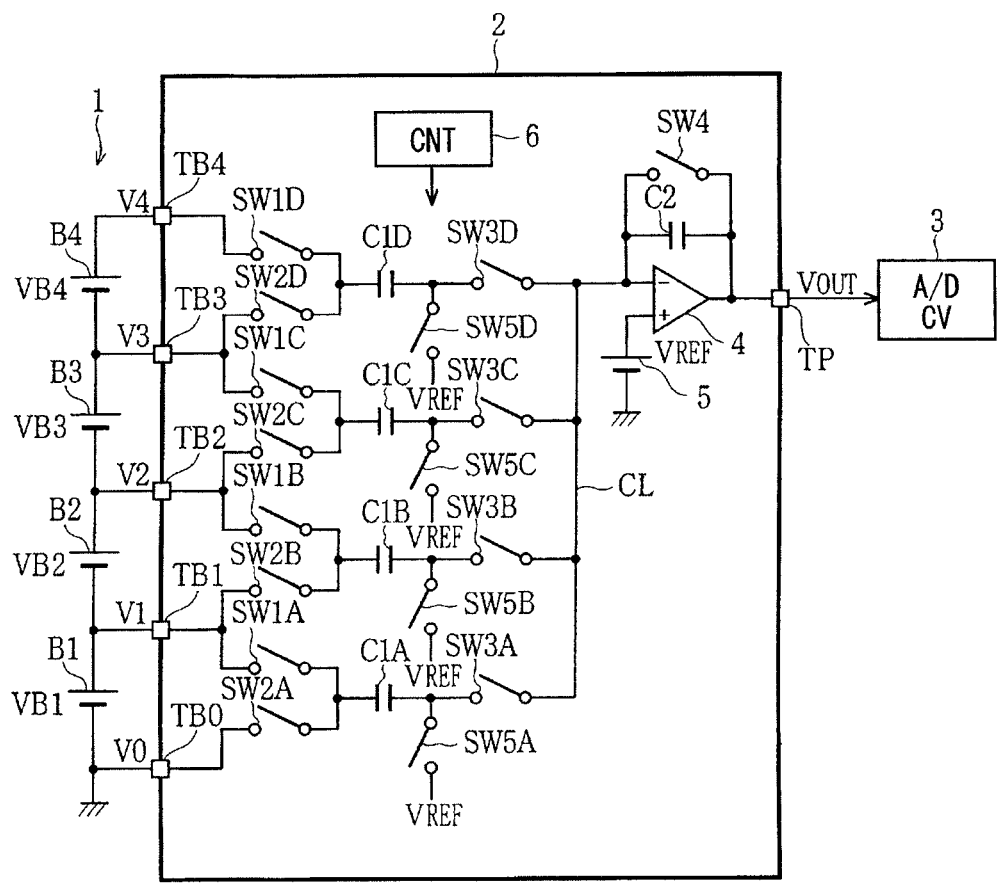
FIG. 1 is a schematic diagram of a voltage detecting device according to a first embodiment of the present disclosure.

Referring to FIG. 1, an assembled battery 1 is, for example, mounted in a hybrid vehicle or an electric vehicle. The assembled battery 1 supplies electric power to an electric motor through an inverter.

The assembled battery 1 includes a plurality of unit batteries connected in series. In an actual assembled battery 1, a large number of lithium rechargeable batteries, a large number of nickel hydride rechargeable batteries, or the like are connected in series, as the unit batteries. In FIG. 1, four battery cells, such as a battery cell B1 on a low-potential side to a battery cell B4 on a high-potential side, are exemplarily illustrated for the convenience of explanation. The battery cell corresponds to the unit battery.

When the battery cell deteriorates, an increase in internal resistance, a decrease in terminal open circuit voltage (electromotive force), and the like occur. A management device (not shown) for the assembled battery 1 measures the internal resistance and the terminal open circuit voltage of each of the battery cells B1 to B4 by simultaneously detecting the voltage of each of the battery cells B1 to B4 and the current flowing in the entirety of the assembled battery 1 using a voltage detecting device 2 shown in FIG. 1 and a current detecting device (not shown). In order to measure the internal resistance and the terminal open circuit voltage at high accuracy, it is necessary to sample the voltage and the current simultaneously.

Terminals of the battery cells B1 to B4 are connected to terminals TB0 to TB4 of the voltage detecting device 2, respectively. The voltages of the terminals TB0 to TB4 are denoted as V0 to V4, respectively. The voltage detecting device 2 samples the battery cells Bn (n=1, 2, 3, 4) at the same time. Thereafter, the voltage detecting device 2 detects the cell voltage VBn of the battery cell Bn using the electric charge held in a sequence order, and outputs the detected cell voltage VBn in a sequence order as an output voltage VOUT from an output terminal TP to an analog-to-digital (A/D) converter 3.

The voltage detecting device 2 may be configured as an integrated circuit (IC) together with other circuits, such as the A/D converter 3. The voltage detecting device 2 includes an operation amplifier 4 having a single end output structure. In other words, the operation amplifier 4 is a single end operation amplifier. The operation amplifier 4 is configured to operate with application of a power supply voltage VDD specified relative to a ground electric potential VSS. A non-inverted input terminal of the operation amplifier 4 is biased to a reference voltage VREF by a voltage generation circuit 5. A second capacitor C2 and a fourth switch SW4 are connected in parallel, between an inverted input terminal of the operation amplifier 4 and an output terminal of the operation amplifier 4.

Capacitance switching circuits having the same structure are provided between the terminals TBn and the operation amplifier 4 correspondingly to the battery cells Bn. For example, the capacitance switching circuit corresponding to the battery cell B4 includes a first capacitor C1D, a first switch SW1D, a second switch SW2D, a third switch SW3D, and a fifth switch SW5D. The first switch SW1D is connected between a high-potential terminal TB4 of the battery cell B4 and a first end of the first capacitor C1D. The second switch SW2D is connected between a low-potential terminal TB3 of the battery cell B4 and the first end of the first capacitor C1D. The low-potential terminal TB3 has a potential lower than the high-potential terminal TB4. The third switch SW3D is connected between a second end of the first capacitor C1D and a common line CL connecting to the inverted input terminal of the operation amplifier 4. The second end of the first capacitor C1D can be applied with a specified voltage VREF, which is set equal to the reference voltage, through the fifth switch SW5D.

The other capacitance switching circuits for the other battery cells Bn are configured similar to the capacitance switching circuit for the battery cell B4. Namely, the capacitance switching circuit for one battery cell Bn includes the first capacitor C1x, the first switch SW1x, the second switch SW2x, the third switch SW3x, and the fifth switch SW5x. The suffix "x" is any of "A", "B", "C" and "D" in a potential increasing order, that is, in an order from the low-potential side toward the high-potential side. Also, "A", "B", "C" and "D" correspond to "1", "2", "3", and "4" of the above-noted "n", respectively. Each of the switches is provided by a metal oxide semiconductor (MOS) transistor. The switches are controlled by a control circuit 6. The control circuit 6 corresponds to a control unit.

Figure 2:
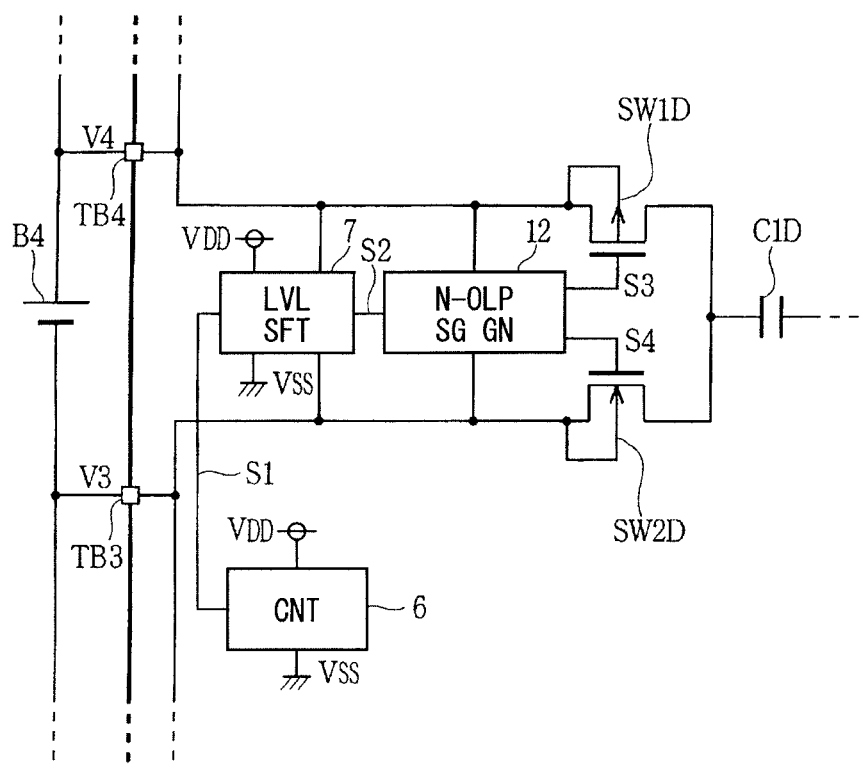
FIG. 2 is a schematic diagram of a part of the voltage detecting device, including a first switch, a second switch and a drive circuit of the first and second switches, according to the first embodiment.

FIG. 2 shows a structure of the first switch SW1D and the second switch SW2D, which are disposed adjacent to the assembled battery 1 from the first capacitor C1x, and a drive circuit for the first switch SW1D and the second switch SW2D. The drive circuit for the first switch SW1D and the second switch SW2D includes a level shift circuit 7 (LVL SFT) and a non-overlap signal generation circuit 12 (N-OLP SG GN). The level shift circuit 7 functions to insulate and to shift the level of a signal S1 that has the ground potential VSS outputted from the control circuit 6 as a reference potential.

Figure 3:
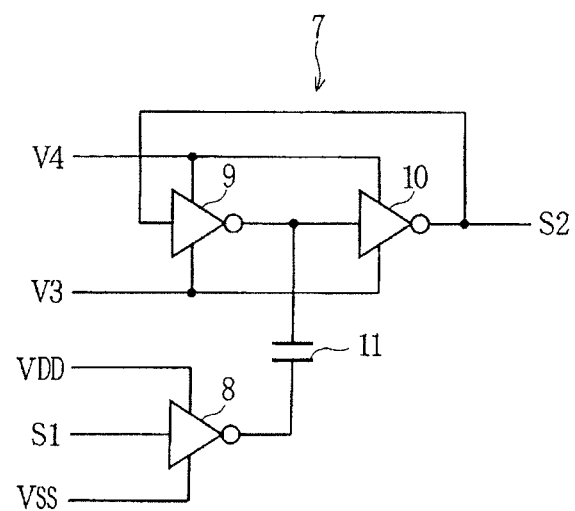
FIG. 3 is a schematic diagram of a level shift circuit of the voltage detecting device according to the first embodiment.

As shown in FIG. 3, the level shift circuit 7 includes inverters 8, 9, 10 and a capacitor 11. The inverter 8 is operated with application of the power supply voltage VDD relative to the ground potential as a reference potential, similar to the control circuit 6. The inverters 9, 10 are operated with application of a voltage VB4 (=V4−V3) relative to a potential V3 of the terminal TB3 as a reference potential. The capacitor 11 insulates between the reference potential circuits. The inverters 9, 10 are connected in a ring shape. The capacitor 11 is connected between an output terminal of the inverter 8 and an input terminal of the inverter 10.

When the signal S1 is inputted to the inverter 8 and the level of the signal S1 is changed, an input electric potential of the inverter 10 is changed through the capacitor 11. Therefore, the input level of the inverter 10 exceeds a threshold value, and an output signal S2 of the inverter 10 is inverted. The signal S2 is inverted through the inverter 9 and applied to the input terminal of the inverter 10. Thus, the signal S2 is outputted in a stable manner. A drive circuit with the ground electric potential VSS as a reference potential can be used for the third switch SW3x, the fourth switch SW4x and the fifth switch SW5x, and therefore, the level shift circuit 7 is unnecessary.

As shown in FIG. 2, the first switch SW1D is, for example, provided by a low withstand voltage PMOS transistor. The second switch SW2D is, for example, provided by a low withstand voltage NMOS transistor. The non-overlap signal generation circuit 12 receives the signal S2 described above, and generates and outputs drive signals S3, S4 to the first switch SW1D and the second switch SW2D so as to activate only one of the first switch SW1D and the second switch SW2D according to the level of the signal S2.

Figure 4:
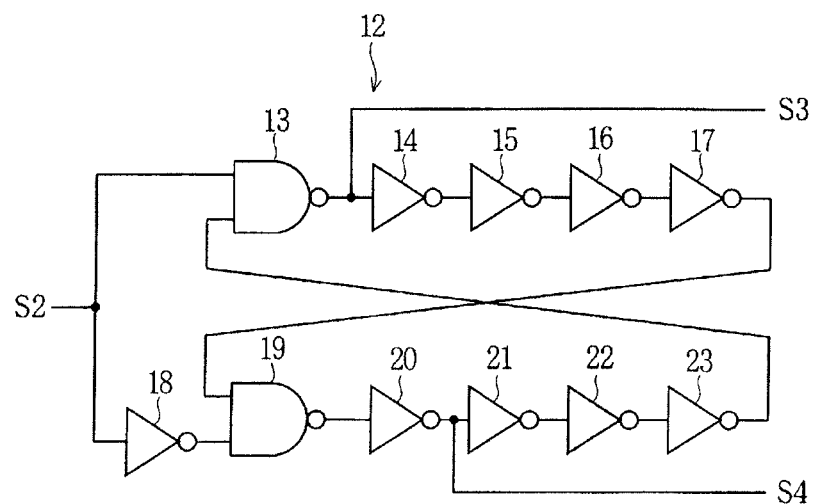
FIG. 4 is a schematic diagram of a non-overlap signal generation circuit of the voltage detecting device according to the first embodiment.

As shown in FIG. 4, the non-overlap signal generation circuit 12 includes a series circuit of an NAND gate 13 and inverters 14 to 17 and a series circuit of an NAND gate 19 and inverters 20 to 23. The inverters 14 to 17 and the inverters 20 to 23 are provided to generate a time delay. An output terminal of the inverter 17 is connected to an input terminal of the NAND gate 19. An output terminal of the inverter 23 is connected to an input terminal of the NAND gate 13.

Figure 5:
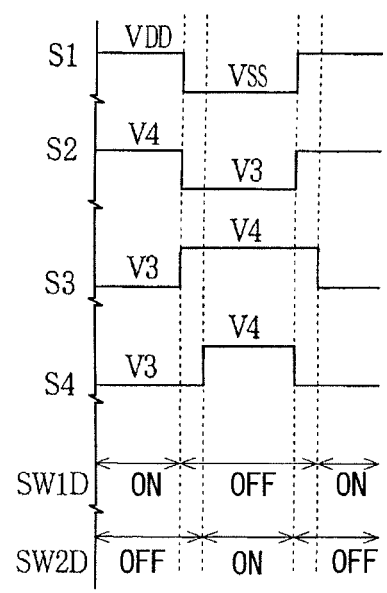
FIG. 5 is a time chart of the non-overlap signal generation circuit according to the first embodiment.

As shown in FIG. 5, in the non-overlap signal generation circuit 12, when the signal S2 inputted to the NAND gate 13 and the inverter 18 is at a low level (L-level, voltage V3), the drive signals S3, S4 are at a high level (H-level, voltage V4). When the signal S2 is at a high level (H-level), the drive signals S3, S4 are at a low level (L-level). When the level of the signal S2 changes, a non-overlapping period where the drive signal S3 is at the high level and the drive signal S4 is at the low level occurs. Thus, it is less likely that the first switch SW1D and the second switch SW2D will be on simultaneously.

Next, operation and advantageous effects of the present embodiment will be described with reference to FIG. 6.

The control circuit 6 controls the switches SW1A to SW1D, SW2A to SW2D so that the first capacitors C1A to C1D simultaneously hold the electric charge according to the voltages VB1 to VB4 of corresponding battery cells B1 to B4. Thereafter, the control circuit 6 switches the SW1A to SW1D, SW2A to SW2D to select the battery cell from the battery cells B1 to B4 as a voltage detection target in a descending order, and to perform redistribution of the electric charge held, thereby to detect the cell voltage VB1 to VB4. The A/V converter 3 performs an analog-to-digital conversion of the detected voltage that is outputted from the voltage detection device 2 in a sequence order. In regard to the status of the switches in FIG. 6, a high level indicates an on state (e.g., closed state) of the switch, and a low level indicates an off state (e.g., opened state) of the switch.

[Period 1]

The control circuit 6 turns on the first switches SW1A to SW1D, the fourth switch SW4, and the fifth switches SW5A to SW5D, and turns off the second switches SW2A to SW2D and the third switches SW3A to SW3D, for all of the battery cells B1 to B4. Thus, the first capacitors C1A to C1D are charged all together at the voltage Vn-VREF (sampling). The second capacitor C2 is reset such that the electric charge of the second capacitor C2 is zero.

In this case, the second switches SW2A to SW2D, which are in the off state, are applied with only the voltages VB1 to VB4, respectively. The input terminal of the operation amplifier 4 is applied with the reference voltage VREF, which is lower than the power supply voltage VDD. Since the reference voltage VREF and the specified voltage VREF are equal, the third switches SW3A to SW3D are applied with no voltage.

[Period 2]

The control circuit 6 turns off the fifth switches SW5A to SW5D simultaneously (at the same time) to hold the electric charge of the battery cells B1 to B4 in the first capacitors C1A to C1D at the same time. In this case, the control circuit 6 may turn off the first switches SW1A to SW1D at the same time or turn off the first switches SW1A to SW1D and the fifth switches SW5A to SW5D at the same time as long as the electric charge can be held. In other words, the control circuit 6 simultaneously turns off at least one of the first switches SW1A to SW or the fifth switches SW5A to SW5D.

The current detecting device, which is not shown, detects the electric current flowing in the assembled battery 1 at the same time the control circuit 6 turns off at least one of the first switches SW1A to SW1D or the fifth switches SW5A to SW5D. The period 1 and the period 2 are not only the charging period and the holding period, but also a resetting period of the second capacitor C2, when the battery cell B4 is the voltage detection target.

[Period 3]

The control circuit 6 selects the battery cell B4 as the voltage detection target. The control circuit 6 turns off the first switch SW1D corresponding to the battery cell B4 and the fourth switch SW4 in preparation for the electric charge redistribution of a period 4. The first switches SW1A to SW1C may be kept in the on state.

[Period 4]

The control circuit 4 turns on the second switch SW2D and the third switch SW3D for the battery cell B4. Thus, the first end of the first capacitor C1D is applied with the voltage V3, in place of the voltage V4. In this case, the electric charge held in the first capacitor C1D in the period 2 is redistributed with the second capacitor C2. Conservation of the electric charge between the period 3 and the period 4 is expressed by a general formula (1), in which C1 denotes a capacitance of the first capacitor and C2 denotes a capacitance of the second capacitor. In regard to the battery cell B4, Vn=V4, and Vn−1=V3.

$$C1(Vn-VREF)=C1(Vn-1-VREF)+C2(VOUT-VREF) \quad (1)$$

The following formula (2) is derived from the formula (1).

$$VOUT=C1/C2(Vn-Vn-1)+VREF \quad (2)$$

That is, after the redistribution of the electric charge, the output voltage VOUT of the operation amplifier 4 becomes the voltage calculated by multiplying the terminal voltage of the battery cell B4 (i.e., the voltage VB4 of the battery cell B4) by C1/C2 and offsetting by the reference voltage VREF. Even in this case, the first switch SW1D and the second switches SW2A to SW2C, which are in the off state, are applied only with the voltages VB1 to VB4 of the battery cells B1 to B4, respectively.

[Period 5]

The control circuit 6 switches the voltage detection target (i.e., target cell) from the battery cell B4 to the battery cell B3. For the battery cell B4, which is not the target cell, the third switch SW3D is turned off to separate the first capacitor C1D from the common line CL. Further, the second switch SW2D is turned off, and the first switch SW1D and the fifth switch SW5D are turned on to perform a sampling operation.

By the operation of the non-overlap signal generation circuit 12, the first switch SW1D and the second switch SW2D are not turned on at the same time. In the period 5, the control circuit 6 temporarily turns on the fourth switch SW4 so as to reset the electric charge of the second capacitor C2.

[Period 6]

Similar the period 3, the control circuit 6 turns off the first switch SW1C and the fourth switch SW4 in preparation for the electric charge redistribution of a period 7. The first switches SW1A, SW1B, SW1D may be kept in the on state.

[Period 7]

Similar to the period 4, the control circuit 6 turns on the second switch SW2C and the third switch SW3C for the battery cell B3. In this case, the electric charge held in the first capacitor C1C in the period 2 is redistributed with the second capacitor C2. The output voltage VOUT of the operation amplifier 4 is expressed by the formula (2) (in this case, Vn=V3, Vn−1=V2).

[Period 8 to Period 13]

In periods 8 to 10, the control circuit 6 selects the battery cell B2 as the target cell, and obtains the output voltage VOUT expressed by the formula (2) (Vn=V2, Vn−1=V1), similar to the periods 5 to 7. Subsequently, in periods 11 to 13, the control circuit 6 selects the battery cell B1 as the target cell, and obtains the output voltage VOUT expressed by the formula (2) (Vn=V1, Vn−t=V0), similar to the periods 5 to 7.

In this way, one cycle of detection of the cell voltages VB1 to VB4 is performed through the periods 1 to 13. The voltage detecting device 2 repeatedly performs the process from the period 1 to the period 13 in accordance with the command from the management device.

In the present embodiment, as described above, the voltage detecting device 2 samples the battery cells Bn at the same time, and then detects the cell voltages VBn using the sampled electric charge in a sequence order. The capacitance switching circuit including the first capacitor C1x and the switches is provided for each of the battery cells Bn. Therefore, a layout area is reduced, as compared with a structure in which a specific A/D converter is provided for each of the battery cells Bn and the sampling is performed at the same time for the battery cells Bn.

The management device for the assembled battery 1 performs sampling of the electric current at the same time as sampling the electric charge. Therefore, for the plurality of battery cells Bn, the internal resistance and the terminal open circuit voltage (electromotive force) of each of the battery cells Bn can be accurately measured by sampling the electric current one time.

In this measuring method, the measuring time can be shortened, as compared with a conventional structure. Further, the calculation for detecting the electric current is performed one time for the plurality of battery cells Bn. Therefore, the amount of calculation for detecting the electric current reduces. As such, the management device may be provided by using less expensive microcomputer with a low calculation capacity.

The first switches SW1x and the second switches SW2x, which forms a circuit adjacent to the assembled battery 1, are only applied with a voltage equal to or lower than the voltage VBn of the single battery cell. The level shift circuit 7 provided with the capacitor 11 for insulation and separation is used to drive the first switch SW1x and the second switch SW2x. Since the reference voltage and the specific voltage are set equal to each other, the third switch SW3x and the fifth switch SW5x, which form a circuit adjacent to the operation amplifier 4, are applied with no voltage. Further, the fourth switch SW4 is only applied with a voltage equal to or lower than the power supply voltage VDD. According to these structures, the operation amplifier 4 and all of the switches can be provided by low withstand voltage transistors. Moreover, since there is no electric charge omission from the first capacitor C1x in accordance with the drive of the switch, the cell voltage VBn can be detected at high accuracy.

The first capacitor C1x needs to withstand a high voltage over the power supply voltage VDD. When an interlayer insulation film of a metal wiring is used, the high voltage withstand can be ensured. Therefore, a specific manufacturing step is unnecessary. As such, the voltage detecting device 2 can be constructed as the IC using the low withstand voltage transistors, such as 5V-system or 3.3 V-system. With this, since the layout area reduces, the manufacturing costs reduce.

Second Embodiment

A second embodiment will be described with reference to FIGS. 7 and 8.

Figure 7:
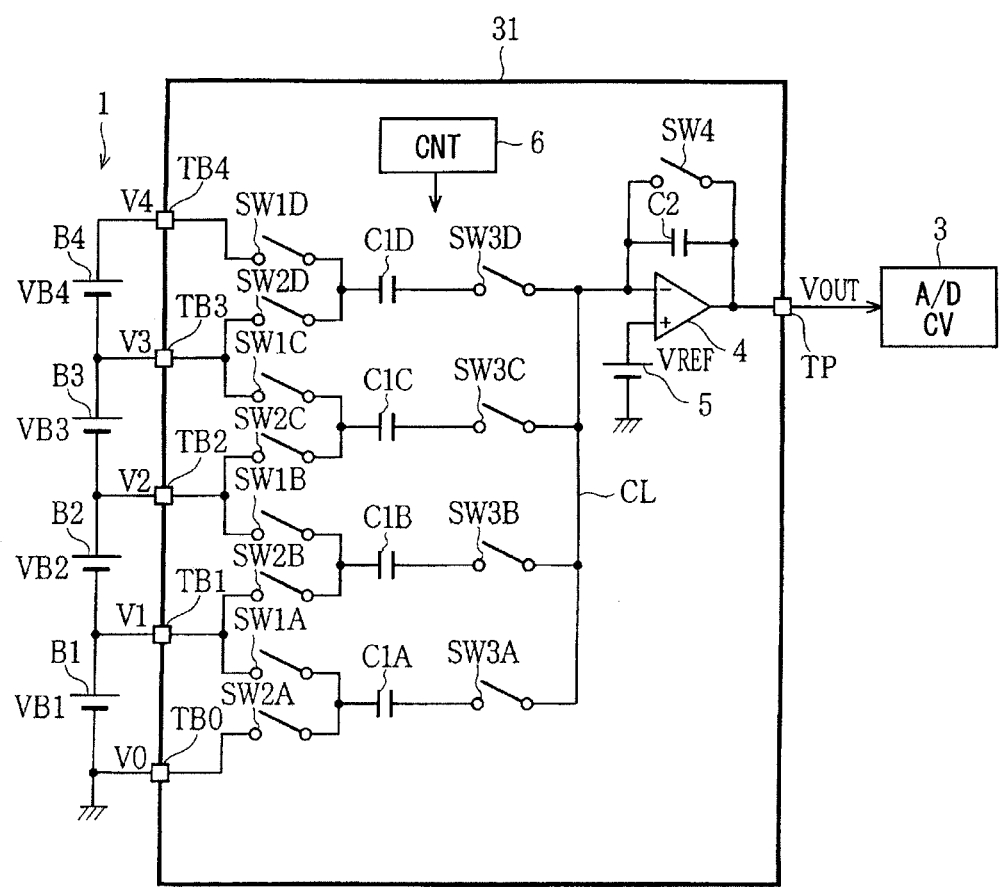
FIG. 7 is a schematic diagram of a voltage detecting device according to a second embodiment of the present disclosure.

As shown in FIG. 7, a voltage detecting device 31 has a similar structure to the voltage detecting device 2 shown in FIG. 1, but does not have the fifth switches SW5A to SW5D. The control circuit 6 simultaneously samples the battery cells B1 to B4, and controls the switches to simultaneously hold the electric charge in the first capacitors C1A to C1D. Thereafter, the control circuit 6 controls the switches to select one of the battery cells B1 to B4 in a descending order as the target cell. The control circuit 6 performs the redistribution of the electric charge held, thereby to detect the voltage of each of the battery cells VB1 to VB4.

[Period 1]

The control circuit 6 turns on the first switches SW1A to SW1D, the third switches SW3A to SW3D and the fourth switch SW4, and turns off the second switches SW2A to SW2D, for all of the battery cells B1 to B4. Thus, the operation amplifier 4 is operated as a voltage follower, and the first capacitors C1A to C1D are simultaneously charged at the voltage Vn−VREF (sampling). The electric charge of the second capacitor C2 is reset to zero. In this case, the second switches SW2A to SW2D, which are in the off state, are only applied with the voltages VB1 to VB4 of the battery cells B1 to B4, respectively.

[Period 2]

The control circuit 6 turns off the third switches SW3A to SW3D simultaneously (at the same time) to hold the electric charge of the battery cells B1 to B4 in the first capacitors C1A to C1D at the same time (holding). The control circuit 6 may simultaneously turn off the first switches SW1A to SW1D, or may simultaneously turn off the first switches SW1A to SW1D and the third switches SW3A to SW3D, as long as the electric charge can be held. That is, the control circuit 6 may simultaneously turn off at least one of the first switches SW1A to SW1D or the third switches SW3A to SW3D.

The current detecting device (not shown) detects the electric current flowing in the assembled battery 1 at the same time as the holding. The period 1 and the period 2 are not only the charging period and the holding period, but also a resetting period of the second capacitor C2, when the battery cell B4 is the voltage detection target (i.e., target cell).

[Period 3]

The control circuit 6 selects the battery cell B4 as the target cell. The control circuit 6 turns off the first switch SW1D and the fourth switch SW4 in preparation for the electric charge redistribution of a period 4. The first switches SW1A to SW1C may be kept in the on state, and the third switches SW3A to SW3C may be kept in the off state.

[Period 4]

The control circuit 4 turns on the second switch SW2D and the third switch SW3D for the battery cell B4. Thus, the first end of the first capacitor C1D is applied with the voltage V3, in place of the voltage V4. In this case, the electric charge held in the first capacitor C1D in the period 2 is redistributed with the second capacitor C2. The conservation of the electric charge between the period 3 and the period 4 is expressed by the formula (1), and the output voltage VOUT of the operation amplifier 4 is expressed by the formula (2). In regard to the battery cell B4, Vn=V4, and Vn−1=V3.

[Period 5]

The control circuit 6 switches the target cell from the battery cell B4 to the battery cell B3. For the battery cell B4, which is not the target cell, the second switch SW2D and the third switch SW3D are turned off to shift to a standby operation. Since the control circuit 6 resets the electric charge of the second capacitor C2, the fourth switch SW4 is temporarily turned on in this period.

[Period 6]

Similar the period 3, the control circuit 6 turns off the first switch SW1C and the fourth switch SW4 in preparation for the electric charge redistribution of a period 7. The first switches SW1A and SW1D may be kept in the on state.

[Period 7]

Similar to the period 4, the control circuit 6 turns on the second switch SW2C and the third switch SW3C for the battery cell B3. In this case, the electric charge held in the first capacitor C1C in the period 2 is redistributed with the second capacitor C2. The output voltage VOUT of the operation amplifier 4 is expressed by the formula (2) (in this case, Vn=V3, and Vn−1=V2).

[Period 8 to Period 13]

In periods 8 to 10, the control circuit 6 selects the battery cell B2 as the target cell, and obtains the output voltage VOUT expressed by the formula (2) (Vn=V2, Vn−1=V1), similar to the periods 5 to 7. Subsequently, in periods 11 to 13, the control circuit 6 selects the battery cell B1 as the target cell, and obtains the output voltage VOUT expressed by the formula (2) (in this case, Vn=V1, Vn−1=V0), similar to the periods 5 to 7.

In this way, one cycle of detection of the voltages VB1 to VB4 is performed through the periods 1 to 13. When the process proceeds from the period 13 to the period 1, the control circuit 6 turns on the first switches SW1A to SW1D, the third switches SW3A to SW3D and the fourth switch SW4 to simultaneously charge the first capacitors C1A to C1D. The voltage detecting device 31 repeatedly performs the process from the period 1 to the period 13 in accordance with the command from the management device.

In the present embodiment, the voltage detecting device 31 does not have the fifth switches SW5A to SW5D. Therefore, the layout area can be reduced by the deletion of the fifth switches SW5A to SW5D. Also in the present embodiment, the advantageous effects similar to the first embodiment will be achieved.

Third Embodiment

A third embodiment will be described with reference to FIGS. 9 and 10.

Figure 9:
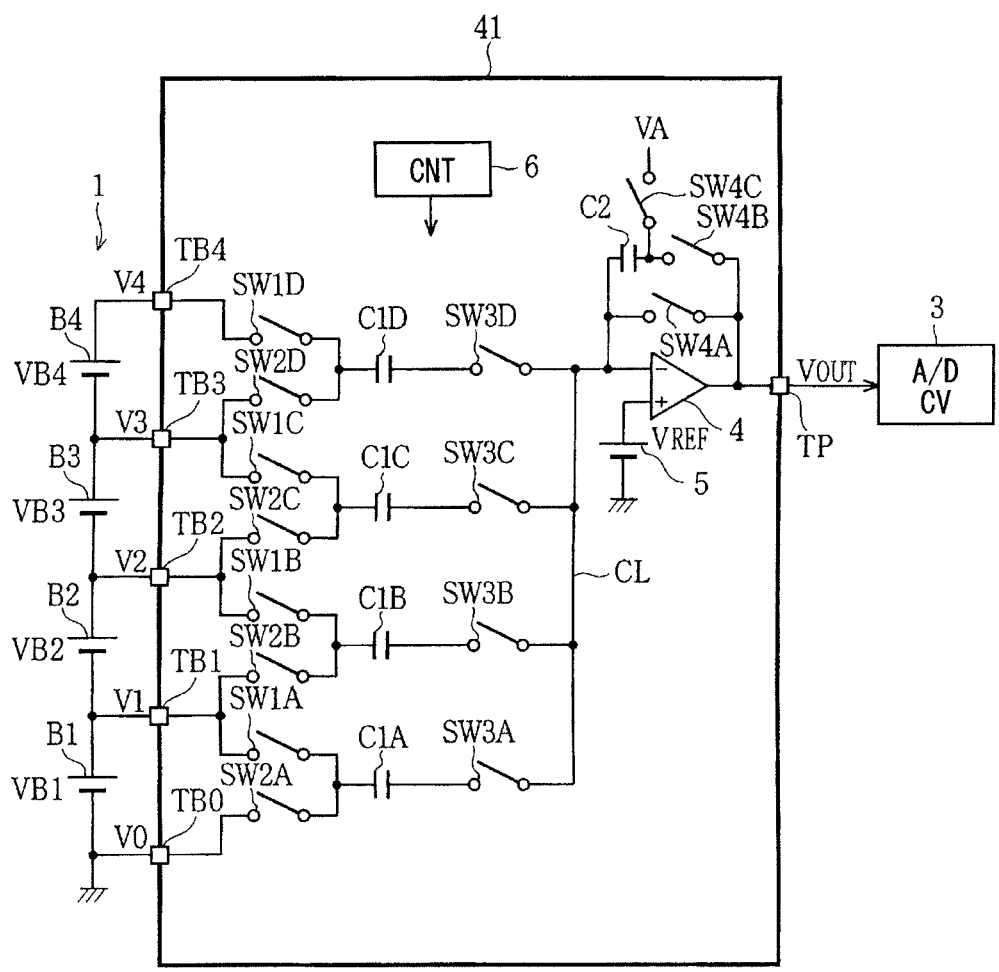
FIG. 9 is a schematic diagram of a voltage detecting device according to a third embodiment of the present disclosure.

As shown in FIG. 9, a voltage detecting device 41 has a structure similar to the voltage detecting device 31 shown in FIG. 7, but the structures of the second capacitor C2 and the fourth switch SW4 are modified from those of the voltage detecting device 31 shown in FIG. 7 so as to reduce the effect of an offset voltage of the operation amplifier 4.

In this case, a fourth switch SW4A is connected between the inverted input terminal of the operation amplifier 4 and the output terminal of the operation amplifier 4. Further, a series circuit of the second capacitor C2 and a fourth switch SW4B is connected in parallel with the fourth switch SW4A. Further, a fourth switch SW4C is connected between a common connecting point between the second capacitor C2 and the fourth switch SW4B and the voltage line to which a constant voltage VA is applied. The fourth switch SW4A will be also referred to as the fourth-A switch SW4A, the fourth switch SW4B will be also referred to as the fourth-B switch SW4B or the ninth switch SW4B, and the fourth switch SW4C will be also referred to as the fourth-C switch SW4C or the tenth switch SW4C. The control circuit 6 controls the fourth-A switch SW4A and the fourth-C switch SW4C so that the fourth-A switch SW4A and the fourth-C switch SW4C are always in the same state.

Structures of the voltage detecting device 41 other than the above are similar to those of the voltage detecting device 31.

The operation of the voltage detecting device 41 will be described with reference to FIG. 10. Hereinafter, referring to the detection of the voltage VB4 of the battery cell B4 as an example, the operation different from the first embodiment will be mainly described.

In the period 1, the control circuit 6 turns on the fourth-A switch SW4A and the fourth-C switch SW4C, and turns off the fourth-B switch SW4B. Thus, the second capacitor C2 is reset with the electric charge according to the voltage VA-VREF.

In the period 3, the control circuit 6 turns off the fourth-A switch SW4A and the fourth-C switch SW4C. In the period 4, the control circuit turns on the fourth-B switch SW4B. In the period 4, the electric charge held in the first capacitor C1D in the period 2 is redistributed with the second capacitor C2. The conservation of the electric charge between the period 3 and the period 4 is expressed by the following general formula (3). The following formula (4) is derived from the formula (3).

$$C1(Vn-VREF)+C2(VA-VREF)=C1(Vn-1-VREF)+C2(VOUT-VREF) \quad (3)$$

$$VOUT=C1/C2(Vn-Vn-1)+VA \quad (4)$$

In general, the operation amplifier has an offset voltage. Considering the offset voltage ΔVOS of the operation amplifier 4, the conservation of the electric charge is expressed by the following general formula (5). When the formula (5) is solved, the offset voltage ΔVOS is offset, and the same result as the formula (4) is obtained.

$$C1(Vn-VREF+\Delta VOS)+C2(VA-VREF+\Delta VOS)=C1(Vn-1-VREF+\Delta VOS)+C2(VOUT-VREF+\Delta VOS) \quad (5)$$

In the present embodiment, since the effect of the offset voltage ΔVOS of the operation amplifier 4 can be removed from the detection voltage VBn of the cell voltage VBn, the voltage detection can be performed at higher accuracy. Also in the present embodiment, the advantageous effects similar to the second embodiment will be achieved.

Fourth Embodiment

A fourth embodiment will be described with reference to FIG. 11.

Figure 11:
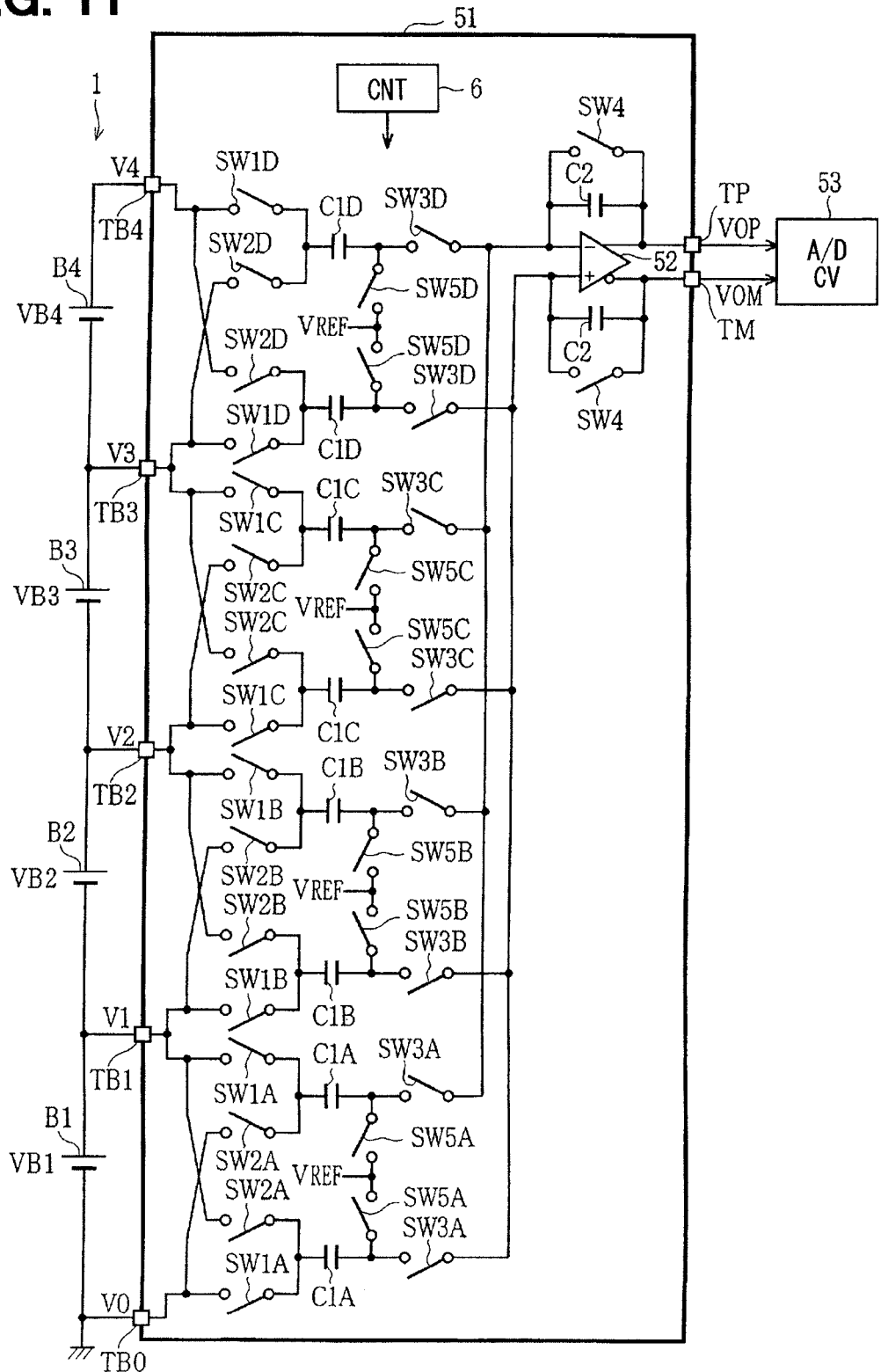
FIG. 11 is a schematic diagram of a voltage detecting device according to a fourth embodiment of the present disclosure.

As shown in FIG. 11, a voltage detecting device 51 includes a differential output operation amplifier 52. That is, the voltage detecting device 51 is provided by modifying the voltage detecting device 2 of the first embodiment into a full differential type. A common voltage VCOM of the operation amplifier 52 is set equal to the reference voltage VREF. The operation amplifier 52 outputs a differential voltage VOP from a non-inverted output terminal and a differential voltage VOM from an inverted output terminal. The differential voltages VOP, VOM outputted from output terminals TP, TM are converted into digital data by a differential input-type A/D converter 53.

Symmetric circuits are provided on one side (e.g., first side) of the operation amplifier 52 including the inverted input terminal and the non-inverted output terminal, and the other side (e.g., second side) of the operation amplifier 52 including the non-inverted input terminal and the inverted output terminal. In other words, a first-side circuit unit and a second-side circuit unit are provided with respect to the operation amplifier 52. Each of the symmetric circuits, that is, each of the first-side circuit unit and the second-side circuit unit, has a connection structure similar to the voltage detecting device 2. In particular, each circuit unit includes the first capacitors C1x, the second capacitor C2, the first switches SW1x, the second switches SW2x, the third switches SW3x, the fifth switches SW5x and the fourth switch SW4. The suffix x is A, B, C, or D in a potential increasing order of the capacitance switching circuits.

In the first-side circuit unit, which corresponds to the inverted input terminal and the non-inverted output terminal of the operation amplifier 52, the first switch SW1x is disposed between the high-potential terminal of the battery cell Bn corresponding to the first capacitor C1x and the first end of the first capacitor C1x. The second switch SW2x is disposed between the low-potential terminal of the battery cell Bn corresponding to the first capacitor C1x and the first end of the first capacitor C1x.

In the second-side circuit unit, which corresponds to the non-inverted input terminal and the inverted output terminal of the operation amplifier 52, the first switch SW1x is disposed between the low-potential terminal of the battery cell Bn corresponding to the first capacitor C1x and the first end of the first capacitor C1x. The second switch SW2x is disposed between the high-potential side terminal of the battery cell Bn corresponding to the first capacitor C1x and the first end of the first capacitor C1x.

Figure 6:
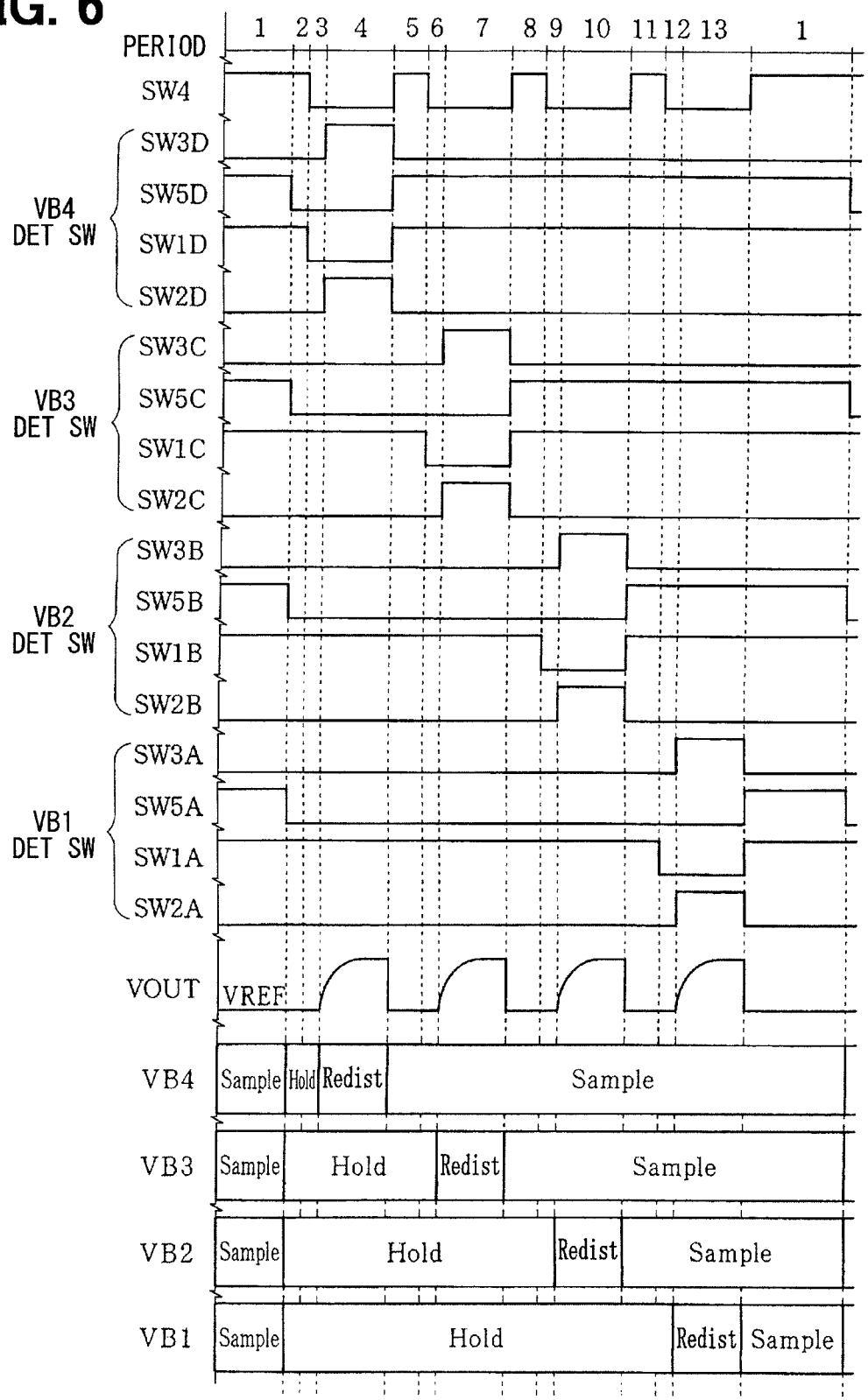
FIG. 6 is a diagram illustrating on and off states of switches, a waveform of an output voltage, and voltage detection states of cell batteries according to the first embodiment.

The control circuit 6 performs a switch control similar to the first embodiment shown in FIG. 6. In this case, the conservation of the electric charge between the period 3 and the period 4 is expressed by the following general formulas (6) and (7). The formula (8) is obtained by subtracting the formula (7) from the formula (6). In the formulas (6) and (7), VX denotes a common voltage on an input side.

$$C1(Vn-VREF)=C1(Vn-1-VX)+C2(VOP-VX) \quad (6)$$

$$C1(Vn-1-VREF)=C1(Vn-VX)+C2(VOM-VX) \quad (7)$$

$$VOP-VOM=2C1/C2(Vn-Vn-1) \quad (8)$$

When common mode noise ΔV is overlapped on the assembled battery 1 at the time of the electric charge redistribution of the period 4, the conservation of the electric charge is expressed by the following general formulas (9) and (10). When the formula (10) is subtracted from the formula (9), the item of ΔV is cancelled, and thus the same result as the formula (8) is obtained. That is, since the voltage detecting device 51 is the full differential type, even if the common mode noise ΔV overlaps on the assembled battery 1 in the redistribution of the electric charge, a differential output voltage VOP-VOM is not affected.

$$C1(Vn-VREF)=C1(Vn-1+\Delta V-VX)+C2(VOP-VX) \quad (9)$$

$$C1(Vn-1-VREF)=C1(Vn+\Delta V-VX)+C2(VOM-VX) \quad (10)$$

As described above, in the present embodiment, since the voltage detecting device 51 is the full differential type, the common mode noise can be removed from the differential output voltage VOP-VOM, not only when the common mode noise is overlapped on the assembled battery 1 in the charging of the first capacitor C1x, but also when the common mode noise is overlapped on the assembled battery 1 in the redistribution of the electric charge. Moreover, since the circuit structure is symmetric with respect to the operation amplifier 52, an error due to a field through occurring in the operations of the switches can be cancelled. Thus, the voltage can be detected at further higher accuracy. Also in the present embodiment, the advantageous effects similar to the first embodiment will be achieved.

Fifth Embodiment

A fifth embodiment will be described with reference to FIG. 12.

Figure 12:
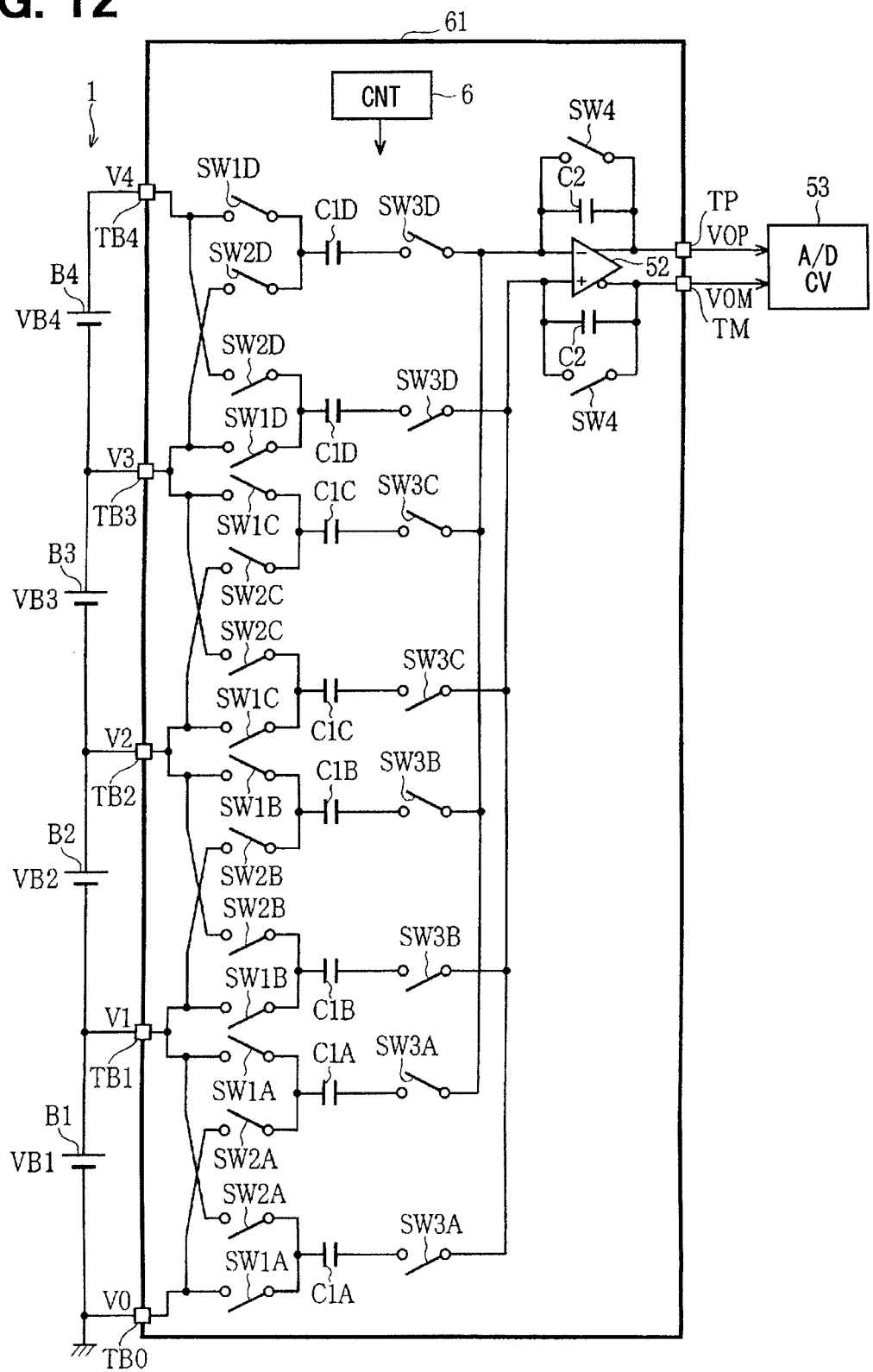
FIG. 12 is a schematic diagram of a voltage detecting device according to a fifth embodiment of the present disclosure.

As shown in FIG. 12, a voltage detecting device 61 includes the differential output operation amplifier 52. That is, the voltage detecting device 61 is provided by modifying the voltage detecting device 31 of the second embodiment into a full differential type.

Symmetric circuits are provided on one side (e.g., first side) of the operation amplifier 52 including the inverted input terminal and the non-inverted output terminal, and the other side (e.g., second side) of the operation amplifier 52 including the non-inverted input terminal and the inverted output terminal. In other words, a first-side circuit unit and a second-side circuit unit are provided with respect to the operation amplifier 52. Each of the symmetric circuits, that is, each of the first-side circuit unit and the second-side circuit unit, has a connection structure similar to the voltage detecting device 31. Each of the first-side circuit unit and the second-side circuit unit includes the first capacitor C1$x$, the second capacitor C2, the first switches SW1$x$, the second switches SW2$x$, the third switches SW3$x$, and the fourth switch SW4. In other words, the voltage detecting device 61 has a similar structure of the voltage detecting device 51 shown in FIG. 11, but the fifth switches SW5A to SW5D are deleted.

Figure 8:
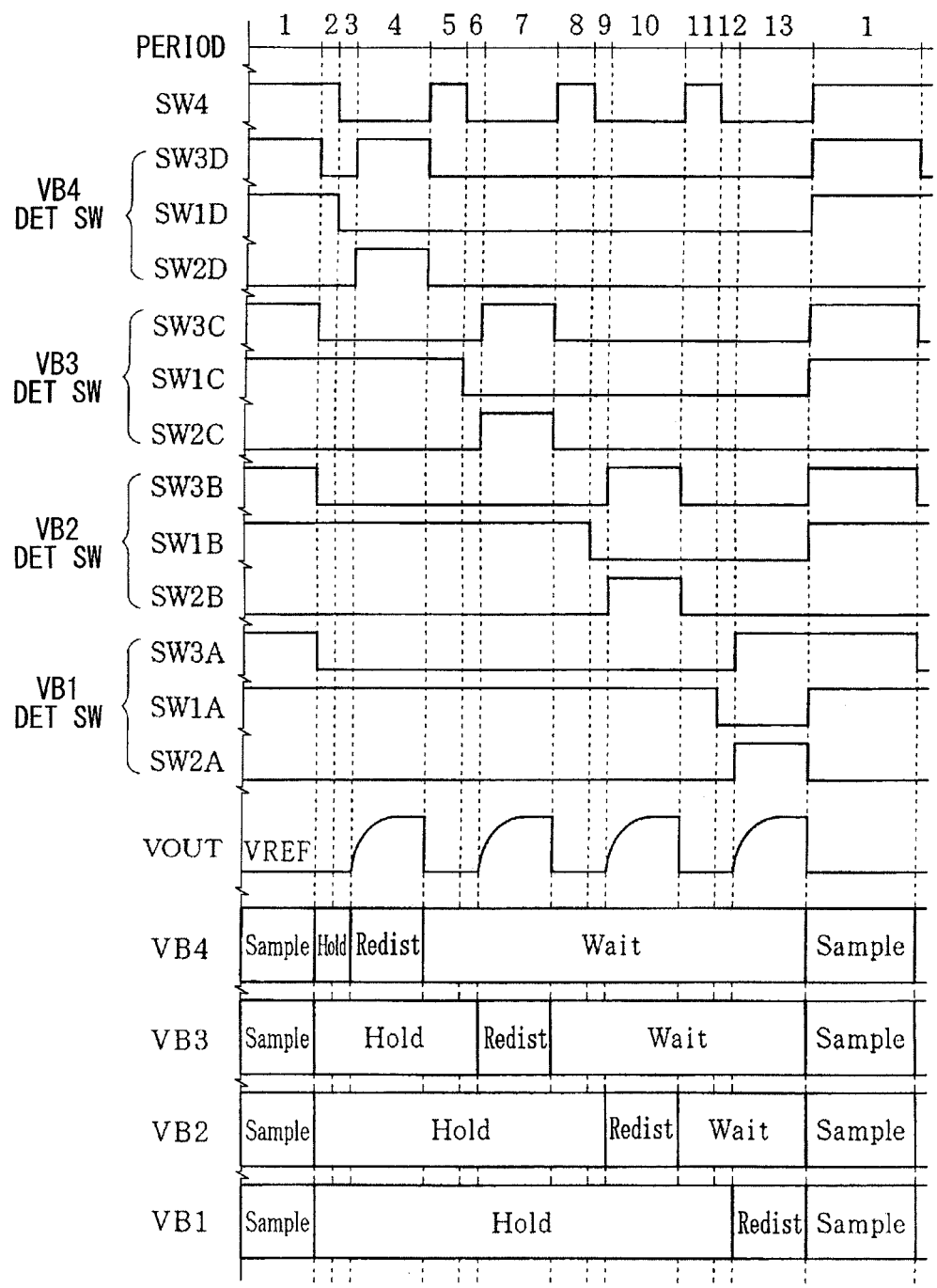
FIG. 8 is a diagram illustrating on and off states of switches, a waveform of an output voltage, and voltage detection states of cell batteries according to the second embodiment.

The control unit 6 performs a switch control similar to that of the second embodiment shown in FIG. 8. In this case, the conservation of the electric charge between the period 3 and the period 4 is expressed by the following general formulas (11) and (12). When the formula (12) is subtracted from the formula (11), the formula (8), which is described hereinabove, is obtained. In the formula (11) and the formula (12), VCOM denotes a common voltage on an output side of the operation amplifier 52, and VX denotes a common voltage on an input side of the operation amplifier 52.

$$C1(Vn-VCOM)=C1(Vn-1-VX)+C2(VOP-VX) \quad (11)$$

$$C1(Vn-1-VCOM)=C1(Vn-VX)+C2(VOM-VX) \quad (12)$$

In the present embodiment, the advantageous effects similar to the fourth embodiment, which is specific to the full differential structure, will be achieved. In addition, the advantageous effects similar to the second embodiment will also be achieved.

Sixth Embodiment

A sixth embodiment will be described with reference to FIG. 13.

A voltage detecting device 71 is provided by modifying the voltage detecting device 41 of the third embodiment into a full differential type.

The first-side circuit unit, which corresponds to the inverted input terminal and the non-inverted output terminal of the operation amplifier 52 and the second-side circuit unit, which corresponds to the non-inverted input terminal and the inverted output terminal of the operation amplifier 52, have a connection structure similar to the voltage detecting device 41, and include the fourth-A switch SW4A, the fourth-B switch SW4B, and the fourth-C switch SW4C. Other structures of the voltage detecting device 71 are similar to the structures of the voltage detecting device 61 shown in FIG. 12.

Figure 10:
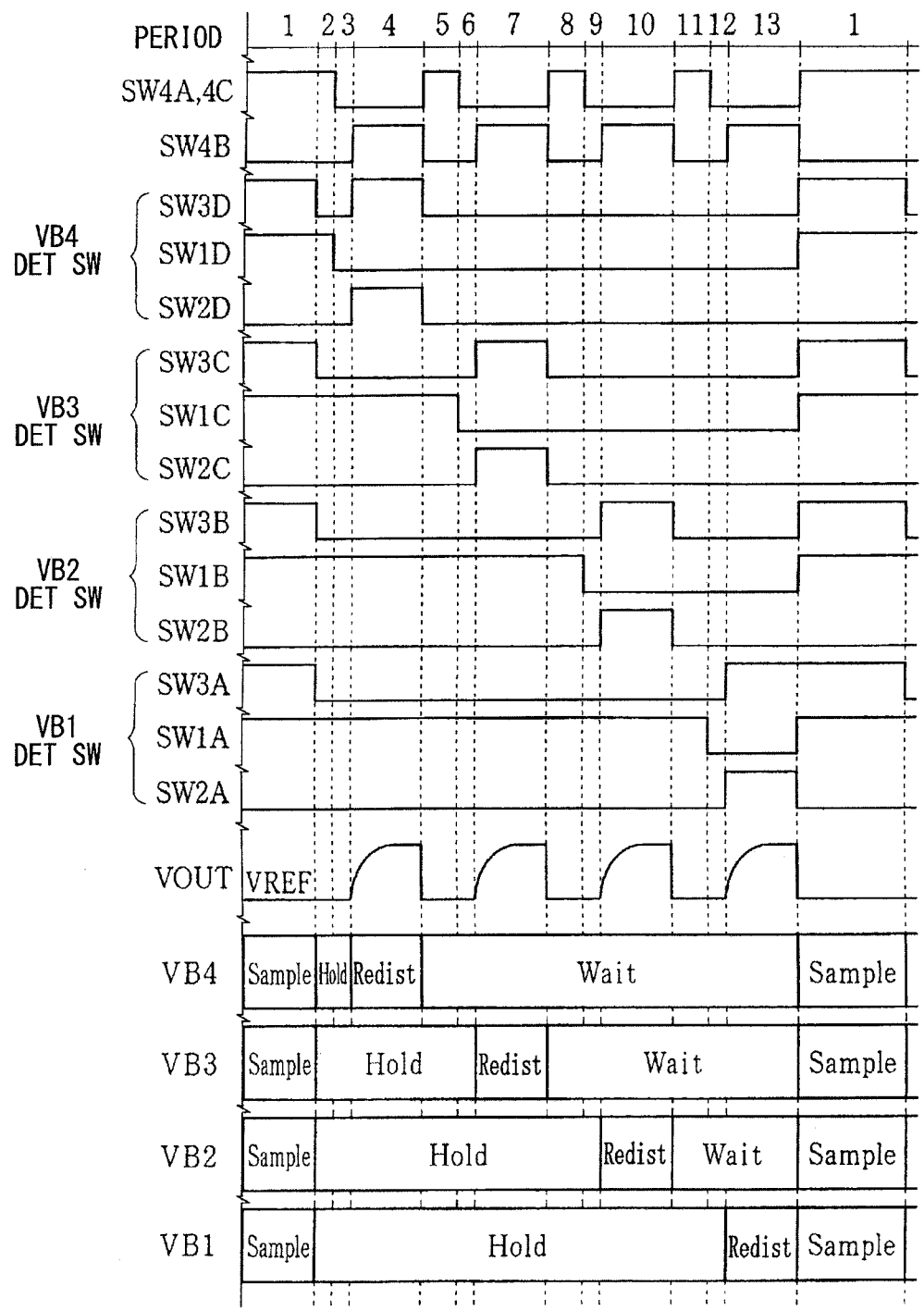
FIG. 10 is a diagram illustrating on and off states of switches, a waveform of an output voltage, and voltage detection states of cell batteries according to the second embodiment.

The control unit 6 performs a switch control similar to the third embodiment shown in FIG. 10. The conservation of the electric charge between the period 3 and the period 4 is expressed by the following general formulas (13) and (14). The following formula (15) is obtained by subtracting the formula (14) from the formula (13).

$$C1(Vn-VCOM)+C2(VA-VCOM)=C1(Vn-1-VX)+C2(VOP-VX) \quad (13)$$

$$C1(Vn-1-VCOM)+C2(VB-VCOM)=C1(Vn-VX)+C2(VOM-VX) \quad (14)$$

$$VOP-VOM=2C1/C2(Vn-Vn-1)+(VA-VB) \quad (15)$$

When the common mode noise $\Delta V$ is overlapped on the assembled battery 1 at the time of the redistribution of the electric charge in period 4, the conservation of the electric charge is expressed by the following general formulas (16) and (17). When the formula (17) is subtracted from the formula (16), the item of $\Delta V$ is cancelled, and thus the same result as the formula (15) is obtained. That is, since the voltage detecting device 71 is the full differential type, even if the common mode noise $\Delta V$ is overlapped on the assembled battery 1 at the time of the redistribution of the electric charge, the differential output voltage VOP–VOM is not affected.

$$C1(Vn-VCOM)+C2(VA-VCOM)=C1(Vn-1+\Delta V-VX)+C2(VOP-VX) \quad (16)$$

$$C1(Vn-1-VCOM)+C2(VB-VCOM)=C1(Vn+\Delta V-VX)+C2(VOM-VX) \quad (17)$$

Further, when the offset voltage VOS of the operation amplifier 52 is considered, the conservation of the electric charge is expressed by the following formula (18), in place of the above-described formula (13). When the formula (14) is subtracted from the formula (18), the item of LVOS is cancelled, and thus the same result as the above-described formula (15) is obtained. That is, in the voltage detecting device 71, the effect of the offset voltage $\Delta$VOS of the operation amplifier 52 can be removed, similar to the third embodiment.

$$C1(Vn-VCOM+VOS)+C2(VA-VCOM+VOS)=C1(Vn-1-VX+VOS)+C2(VOP-VX+VOS) \quad (18)$$

In the present embodiment, the advantageous effects similar to the fourth embodiment, which is specific to the full differential structure, will be achieved. In addition, the advantageous effects similar to the third embodiment will also be achieved.

Seventh Embodiment

A seventh embodiment will be described with reference to FIG. 14.

A voltage detecting device 81 is provided by modifying the structure of the second switches of the voltage detecting device 61 of the sixth embodiment. In particular, the second switch SW2$x$ is commonly disposed between the first end of the first capacitor C1$x$ of the first-side circuit unit connected to the inverted input terminal of the operation amplifier 52 and the first end of the first capacitor C1$x$ of the second-side circuit unit connected to the non-inverted input terminal of the operation amplifier 52. Other structures of the voltage detecting device 81 are similar to the structures of the voltage detecting device 71 shown in FIG. 10.

In the period 4 where the second switch SW2$x$ is in the on state, when a voltage of the connection node between the two first capacitors C1$x$ is referred to as VY, the conservation of the electric charge between the period 3 and the period 4 is expressed by the following general formulas (19) and (20). A formula (21) is obtained by subtracting the formula (20) from the formula (19). That is, by adjusting the capacitance ratio, the differential output voltage VOP−VOM is the same as that expressed by the formula (15) of the sixth embodiment.

$$C1(Vn-VCOM)+C2(VA-VCOM)=C1(VY-VX)+C2(VOP-VX) \quad (19)$$

$$C1(Vn-1-VCOM)+C2(VB-VCOM)=C1(VY-VX)+C2(VOM-VX) \quad (20)$$

$$VOP-VOM=C1/C2(Vn-Vn-1)+(VA-VB) \quad (21)$$

In the present embodiment, not only when the common mode noise is overlapped on the assembled battery 1 at the time of charging the first capacitor C1$x$, but also when the common mode noise is overlapped on the assembled battery 1 at the time of the redistribution of the electric charge, the common mode noise can be removed from the differential output voltage VOP−VOM of the operation amplifier 52 and from the input side common voltage VX of the operation amplifier 52. In regard to the error due to the field through and the effect of the offset voltage ΔVOS of the operation amplifier 52, the advantageous effects similar the sixth embodiment will also be achieved.

Eighth Embodiment

An eighth embodiment will be described with reference to FIGS. 15 and 16.

A voltage detecting device 91 is provided by adding a voltage-dividing circuit 92, a third capacitor C3, a seventh switch SW7 and an eighth switch SW8 to the voltage detecting device 2 shown in FIG. 1, so as to detect a divided voltage VDIV of an entire voltage VBLK of the entire assembled battery 1.

A sixth switch SW6 and the voltage-dividing circuit 92 are connected in series, between a high potential terminal TBH and a low potential terminal TBO (ground). The voltage-dividing circuit 92 is provided by a series circuit of a resistor R1 and a resistor R2 connected in series to each other. A voltage dividing node of the resistor R1 and the resistor R2 is connected to a first end of the third capacitor C3. The seventh switch SW7 is connected between the common line CL and a second end of the third capacitor C3. The second end of the third capacitor C3 can be applied with the specified voltage VREF through the eighth switch SW8. The sixth switch SW6, the seventh switch SW7 and the eighth switch SW8 are provided by MOS transistors. The sixth switch SW6, the seventh switch SW7 and the eighth switch SW8 are controlled by the control circuit 6.

Next, an operation of the voltage detecting device 91 will be described with reference to FIG. 16. Hereinafter, an operation of the voltage detecting device 91 different from the operation of the first embodiment will be mainly described.

In the period 1, the control circuit 6 turns on the sixth switch SW6 and the eighth switch SW8 in addition to the first switches SW1A to SW1D, the fourth switch SW4, and the fifth switches SW5A to SW5D, and turns off the seventh switch SW7 in addition to the second switches SW2A to SW2D and the third switches SW3A to SW3D. Thus, the first capacitors C1A to C1D are charged, as well as the third capacitor C3 is charged at the divided voltage VDIV (sampling).

In the period 2, the control circuit 6 turns off the fifth switches SW5A to SW5D and the eighth switch SW8 simultaneously (at the same time), so that the first capacitors C1A to C1D and the third capacitor C3 hold the electric charge at the same time (holding). The period 1 and the period 2 are not only the charging period and the holding period, but also a resetting period of the second capacitor C2 for detecting the divided voltage VDIV. In the period 3, the control circuit 6 turns off the sixth switch SW6 and the fourth switch SW4 in preparation for the redistribution of the electric charge of the period 4.

In the period 4, the control circuit 6 turns on the seventh switch SW7, and detects the divided voltage VDIV of the assembled battery 1. In this case, the electric charge held in the third capacitor C3 in the period 2 is redistributed with the second capacitor C2. The voltage VBLK of and the divided voltage VDIV of the assembled battery 1 satisfy a relationship expressed by the following formula (22). Also, the conservation of the electric charge between the period 3 and the period 4 is expressed by the following formula (23). In this case, the voltage division ratio R2/(R1+R2) may be set equal to a value obtained by dividing 1 by the total number of the battery cells (i.e., 1/total cell number).

$$VDIV=R2/(R1+R2) \times VBLK \quad (22)$$

$$C3(VDIV-VREF)=C3(0-VREF)+C2(VOUT-VREF) \quad (23)$$

The following formula (24) is derived by solving the formula (22) and the formula (23).

$$VOUT=(C1/C2)VDIV+VREF \quad (24)$$

In the period 5, the control circuit 6 turns off the seventh switch SW7 and turns on the eighth switch SW8. If the sampling operation is started in a state where the sixth switch SW6 is turned on, an electric current flows in the voltage-dividing circuit 92, resulting in loss. Therefore, the sixth switch 6 is kept in the off state to be in the standby operation, until the period 1 begins next. From the period 5 to the period 16, the control circuit 6 detects the cell voltages VB4 to VB1 in a sequence order.

In the present embodiment, the management device of the assembled battery 1 can perform a fault diagnosis of the voltage detecting device 91 by comparing the addition of the cell voltages VBn of the battery cells Bn and the entire voltage VBLK of the entire assembled battery 1. For example, a differential voltage (absolute value) between the total addition voltage of the cell voltages Bn and the entire voltage VBLK of the assembled battery 1 is calculated. When the differential voltage is lower than a predetermined threshold, it is determined that the voltage detecting device 91 is normal. When the differential voltage is equal to or higher than the predetermined threshold, it is determined that the voltage detecting device 91 has a fault.

The cell voltages Bn of all the battery cells Bn and the divided voltage VDIV of the assembled battery 1 are sampled at the same time. Therefore, even if a variation in battery voltage is large, the fault determination can be accurately performed. The fault determination may be performed by the control circuit 6. Also in ninth to fourteenth embodiments which will be described later, the fault determination may be performed by the control circuit 6. Since the fault determination is performed, the reliability of the cell voltages VBn detected by the voltage detecting device 91 improves.

Ninth Embodiment

A ninth embodiment will be described with reference to FIGS. 17 and 18.

Figure 15:
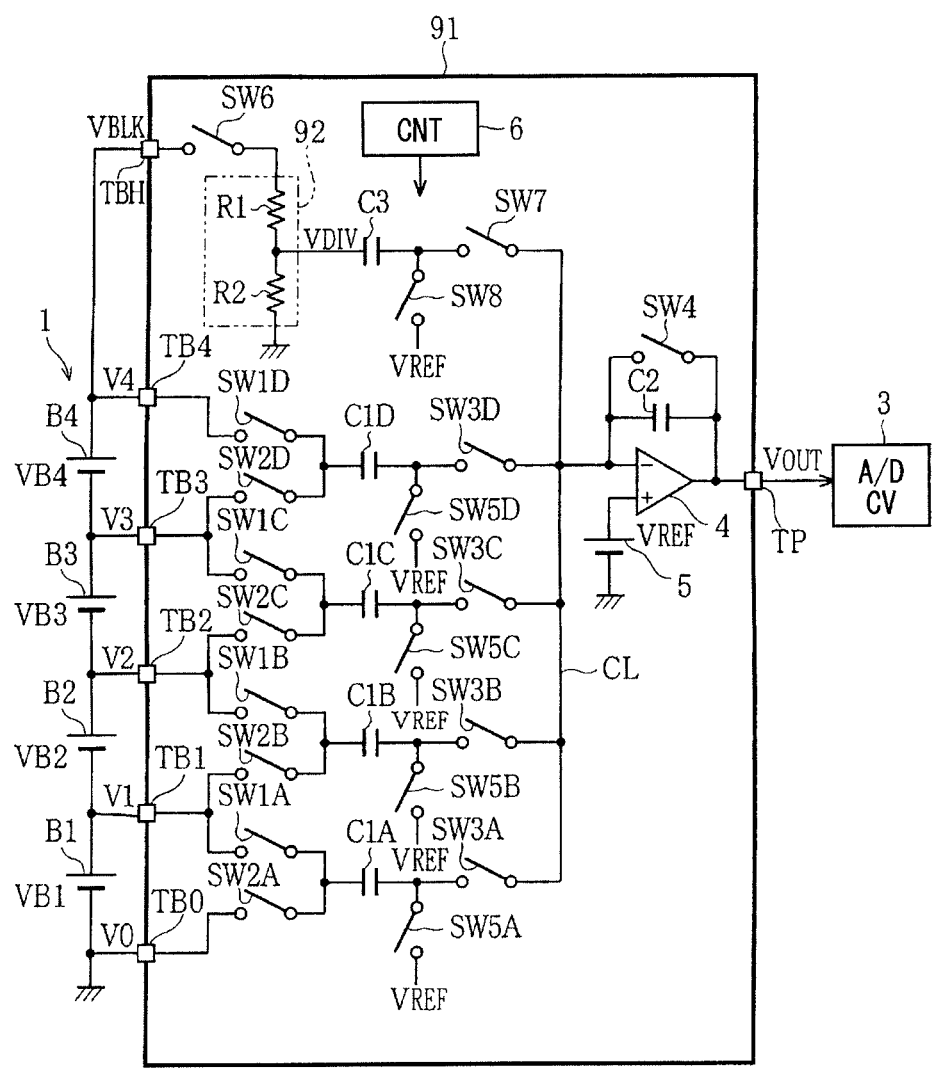
FIG. 15 is a schematic diagram of a voltage detecting device according to an eighth embodiment of the present disclosure.
Figure 16:
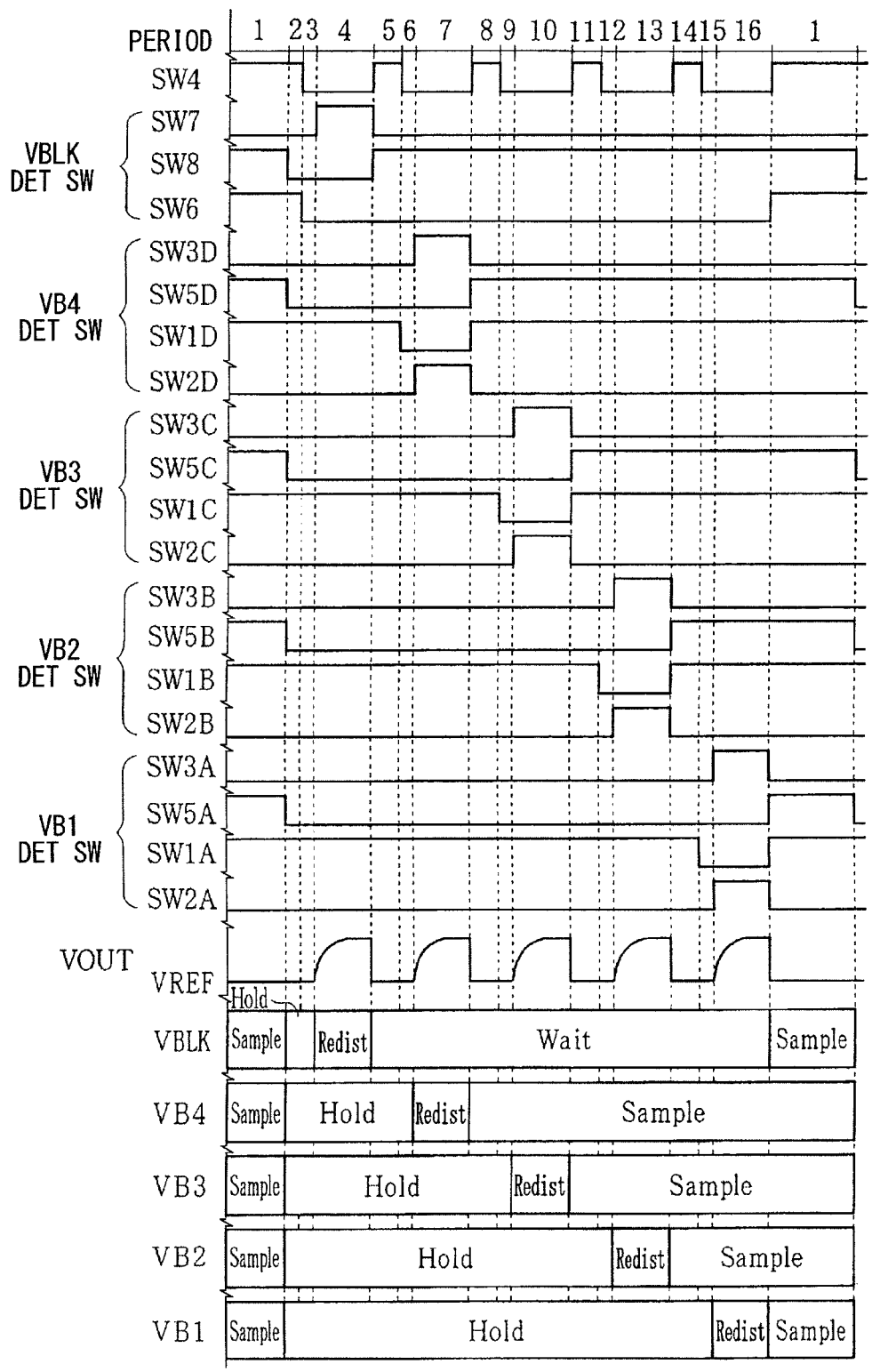
FIG. 16 is a diagram illustrating on and off states of switches, a waveform of an output voltage, and voltage detection states of cell batteries according to the eighth embodiment.
Figure 17:
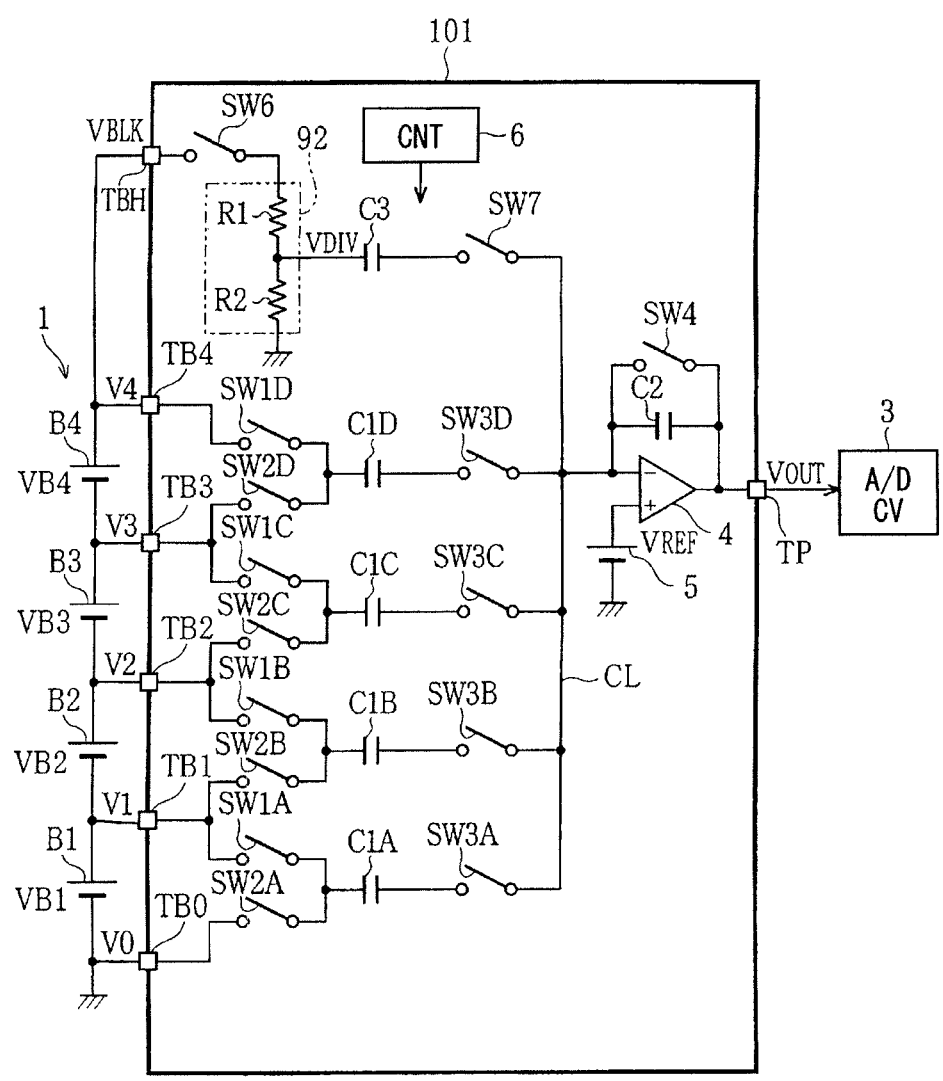
FIG. 17 is a schematic diagram of a voltage detecting device according to a ninth embodiment of the present disclosure.
Figure 18:
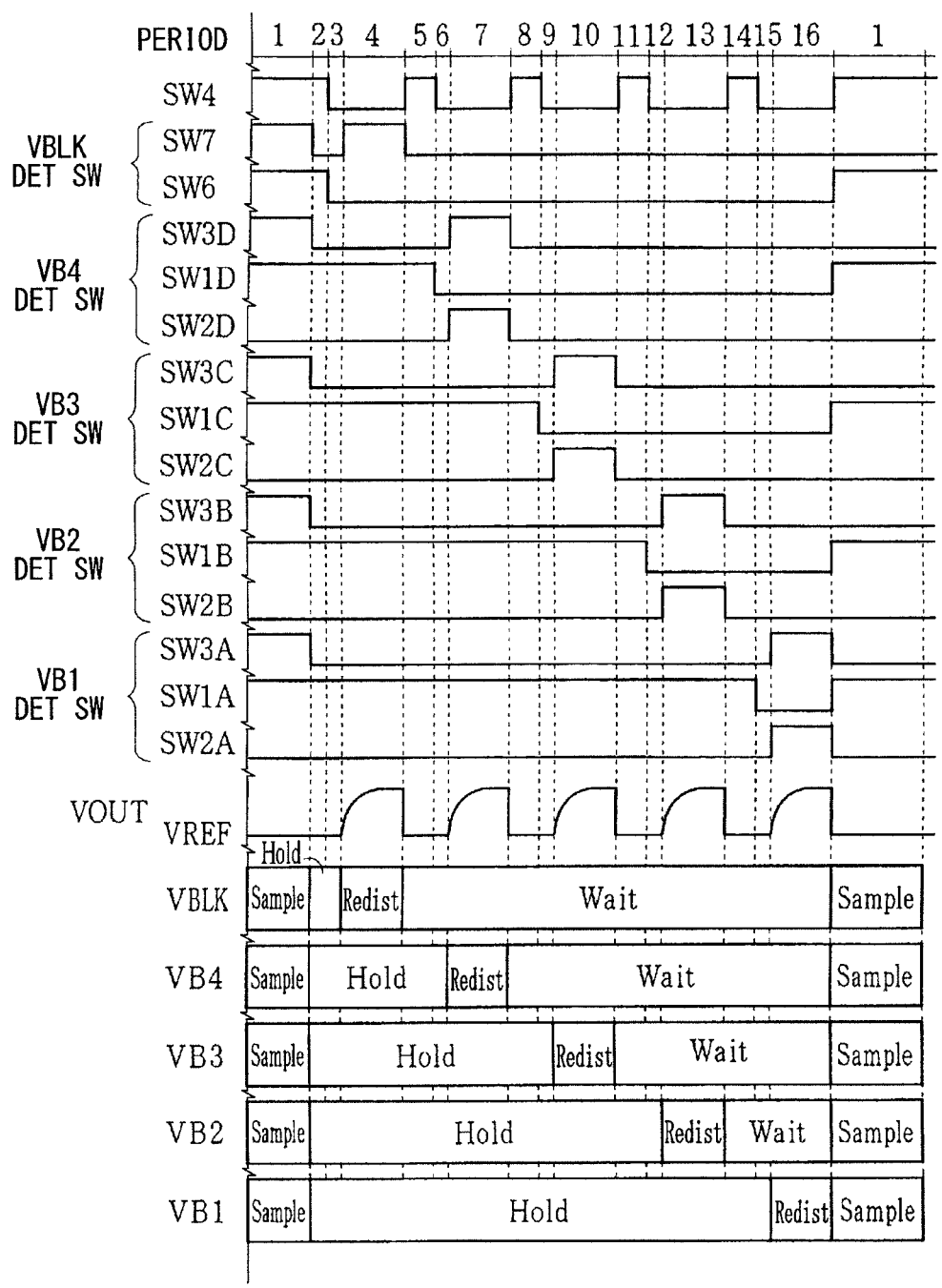
FIG. 18 is a diagram illustrating on and off states of switches, a waveform of an output voltage, and voltage detection states of cell batteries according to the ninth embodiment.

As shown in FIG. 17, a voltage detecting device 101 has a structure similar to the voltage detecting device 91 shown in FIG. 15, but the fifth switches SW5A to SW5D and the eighth switch SW8 are deleted.

In the period 1, the control circuit 6 turns on the first switches SW1A to SW1D, the third switches SW3A to SW3D, the fourth switch SW4, the sixth switch SW6 and the seventh switch SW7, and turns off the second switches SW2A to SW2D. Thus, the operation amplifier 4 operates in a voltage follower. The first capacitors C1A to C1D are charged, and the third capacitor C3 is charged at the divided voltage VDIV (sampling).

In the period 2, the control circuit 6 turns on the third switches SW3A to SW3D and the seventh switch SW7 simultaneously (at the same time), so that the first capacitors C1A to C1D and the third capacitor C3 hold the electric charge at the same time (holding). The period 1 and the period 2 are not only the charging period and the holding period, but also the resetting period of the second capacitor C2 for detecting the divided voltage VDIV. In the period 3, the control circuit 6 turns off the sixth switch SW6 and the fourth switch SW4 in preparation for the redistribution of the electric charge of the period 4.

In the period 4, the control circuit 6 turns on the seventh switch SW7, and detects the divided voltage VDIV of the assembled battery 1. In this case, the electric charge held in the third capacitor C3 in the period 2 is redistributed with the second capacitor C2, and the operation amplifier 4 outputs the voltage VOUT expressed by the formula (24). In period 5, the control circuit 6 turns off the seventh switch SW7 to shift to a standby operation for the divided voltage VDIV. From the period 5 to the period 16, the control circuit 6 detects the cell voltages VB4 to VB1 in a sequence order.

In the present embodiment, the advantageous effects similar to the second and eighth embodiment will be achieved.

Tenth Embodiment

A tenth embodiment will be described with reference to FIGS. 19 and 20.

Figure 19:
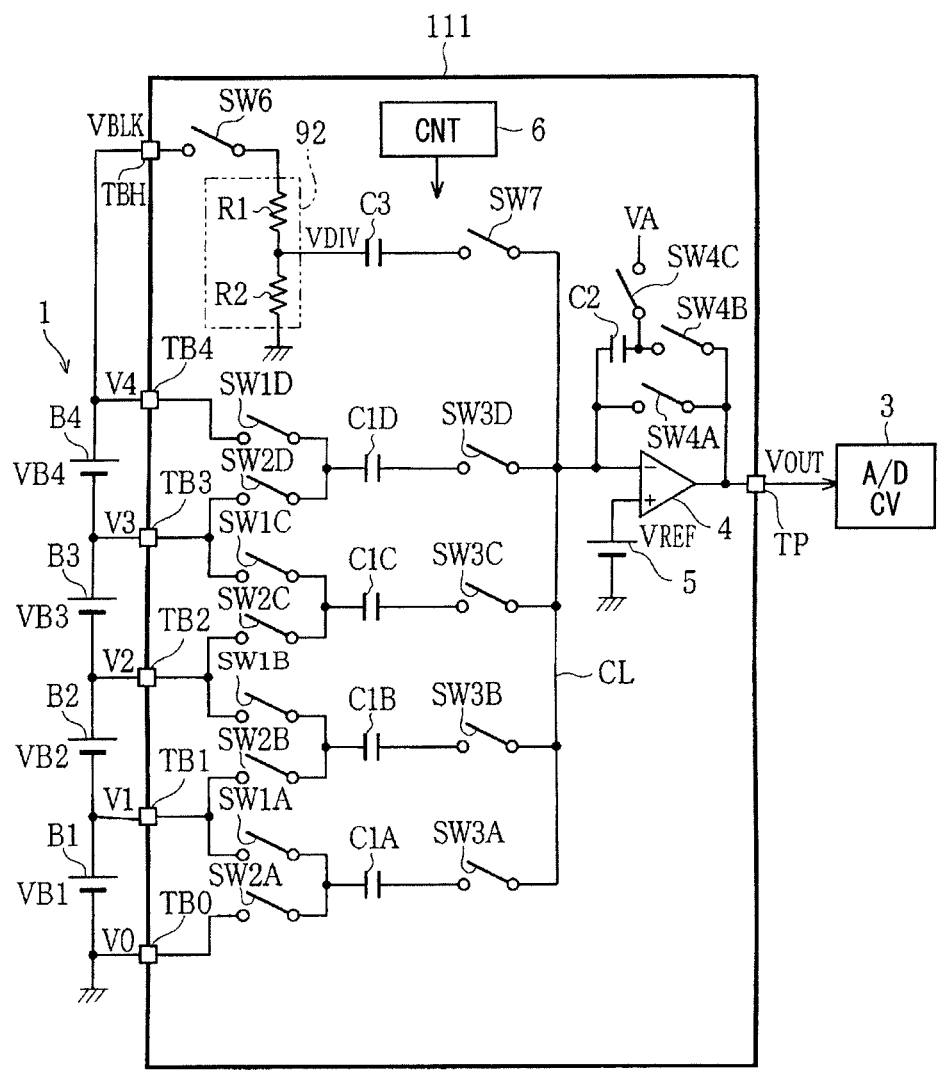
FIG. 19 is a schematic diagram of a voltage detecting device according to a tenth embodiment of the present disclosure.

As shown in FIG. 19, a voltage detecting device 111 is provided by modifying the structures of the second capacitor and the fourth switch in the voltage detecting device 101 shown in FIG. 17, so as to remove the effect of the offset voltage of the operation amplifier 4. The second capacitor and the fourth switch have the structures similar to the second capacitor and the fourth switch shown in FIG. 9.

Figure 20:
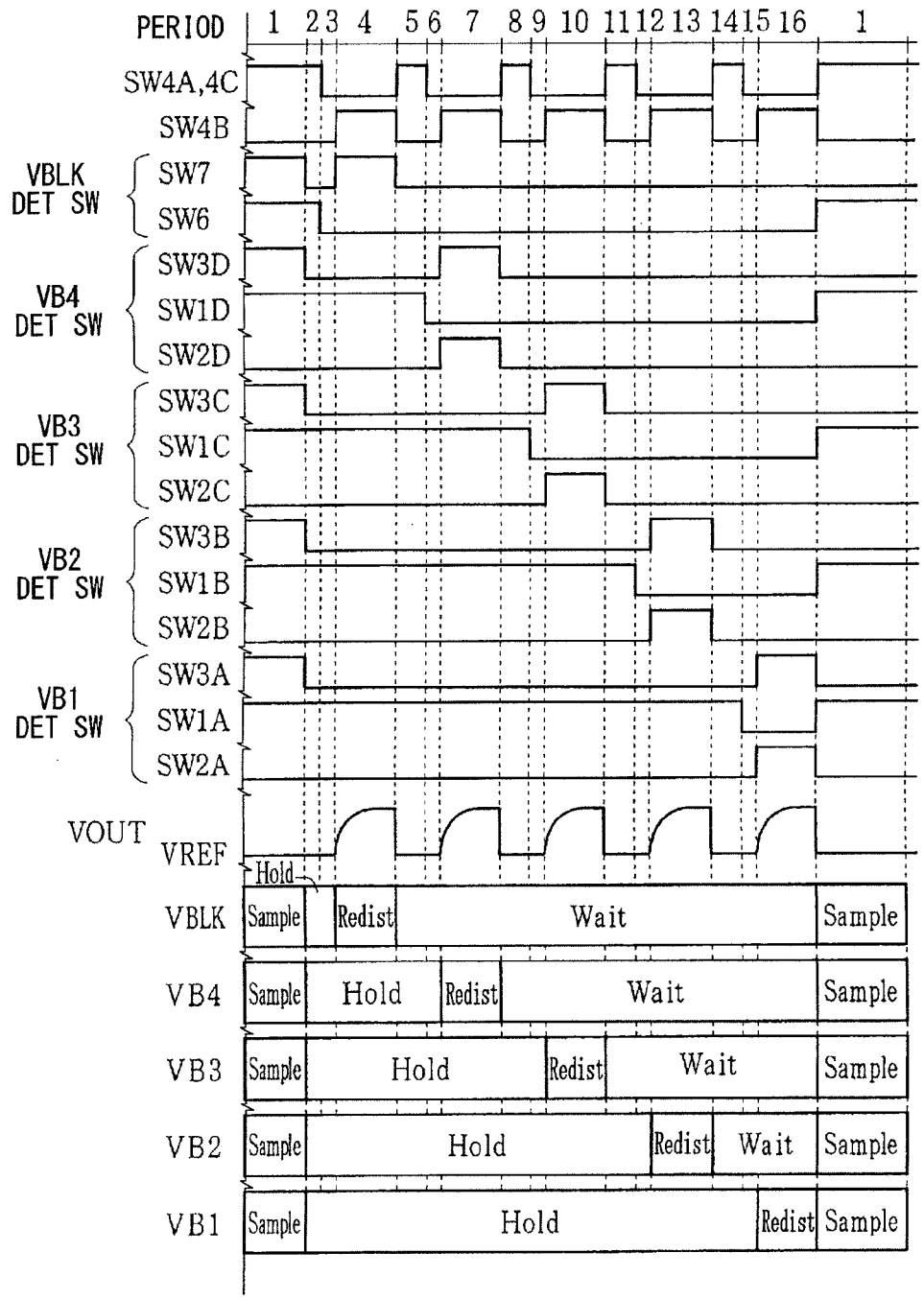
FIG. 20 is a diagram illustrating on and off states of switches, a waveform of an output voltage, and voltage detection states of cell batteries according to the tenth embodiment.

As shown in FIG. 20, in the period 1, the control circuit 6 turns on the fourth-A switch SW4A and the fourth-C switch SW4C, and turns off the fourth-B switch SW4B. In the period 3, the control circuit 6 turns off the fourth-A switch SW4A and the fourth-C switch SW4C. In the period 4, the control circuit 6 turns on the fourth-B switch SW4B.

In the present embodiment, the advantageous effects similar to the third and ninth embodiments will be achieved.

Eleventh Embodiment

Figure 21:
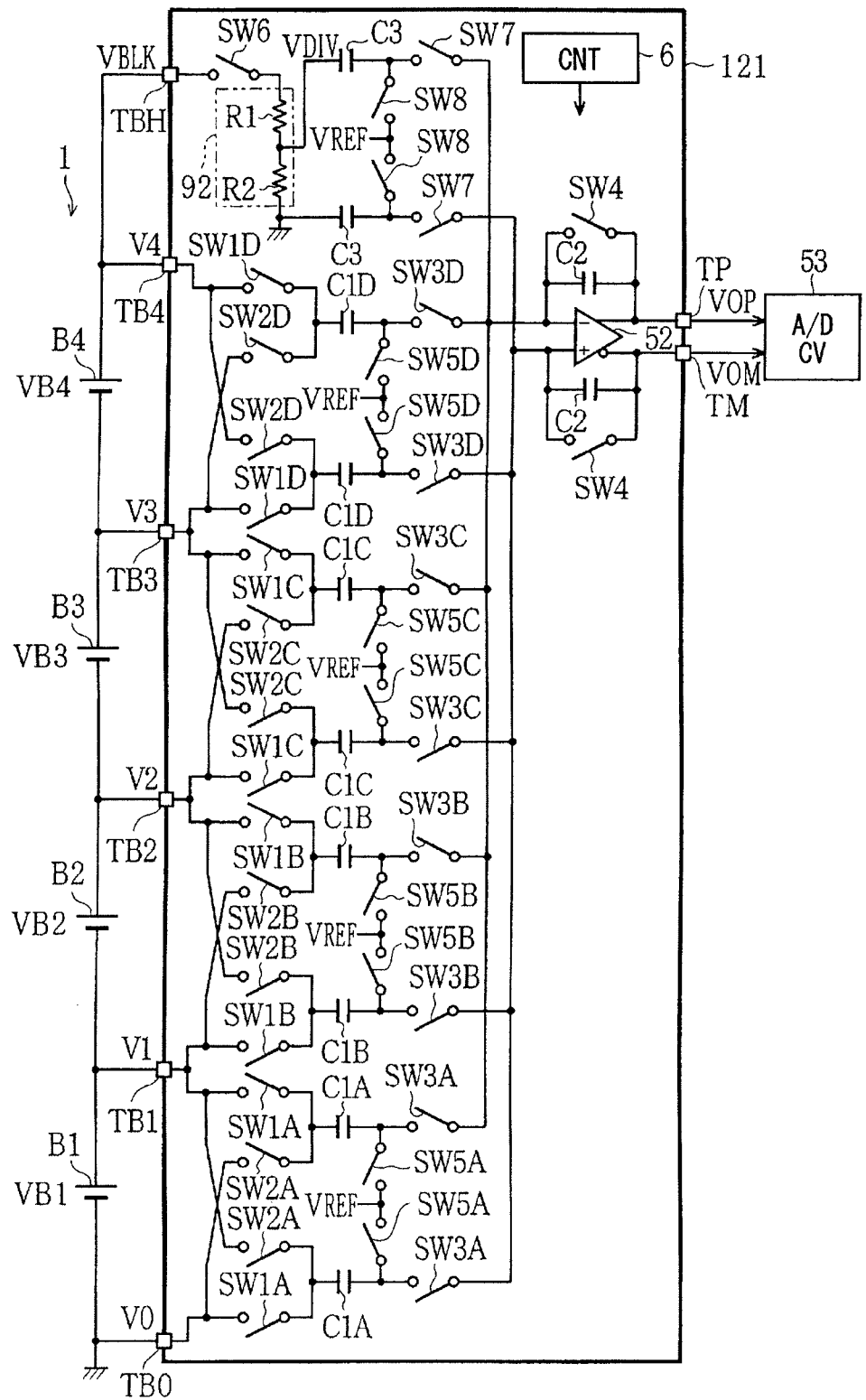
FIG. 21 is a schematic diagram of a voltage detecting device according to an eleventh embodiment of the present disclosure.

An eleventh embodiment will be described with reference to FIG. 21.

As shown in FIG. 11, a voltage detecting device 121 is provided by modifying the structure shown in FIG. 15 for detecting the divided voltage VDIV of the assembled battery 1 into a differential type and adding the modified structure to the voltage detecting device 51 shown in FIG. 11.

In the first-side circuit unit, which corresponds to the inverted input terminal of the operation amplifier 52, the first end of the third capacitor C3 is connected to the voltage-dividing node of the voltage-dividing circuit 92. In the second-side circuit unit, which corresponds to the non-inverted input terminal of the operation amplifier 52, the first end of the third capacitor C3 is connected to the terminal TBO (ground). The control circuit 6 performs a switch control similar the eighth embodiment shown in FIG. 16.

In the present embodiment, the advantageous effects similar to the fourth and eighth embodiments will be achieved.

Twelfth Embodiment

Figure 22:
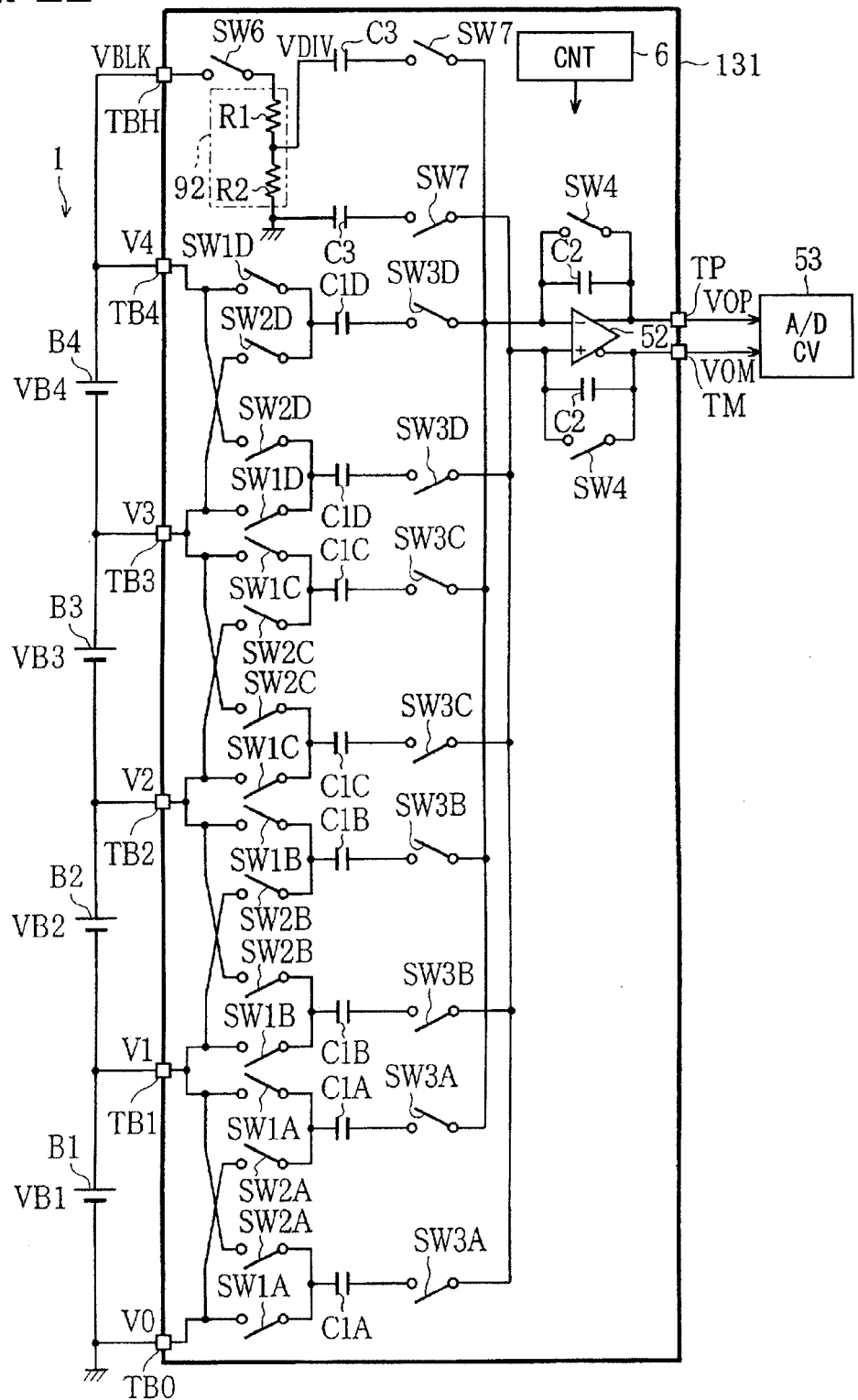
FIG. 22 is a schematic diagram of a voltage detecting device according to a twelfth embodiment of the present disclosure.

A twelfth embodiment will be described with reference to FIG. 22.

As shown in FIG. 12, a voltage detecting device 131 is provided by modifying the structure shown in FIG. 17 for detecting the divided voltage VDIV of the assembled battery 1 into a differential type and adding the modified structure to the voltage detecting device 61 shown in FIG. 12.

In the first-side circuit unit, which corresponds to the inverted input terminal of the operation amplifier 52, the first end of the third capacitor C3 is connected to the voltage-dividing node of the voltage-dividing circuit 92. In the second-side circuit unit, which corresponds to the non-inverted input terminal of the operation amplifier 52, the first end of the third capacitor C3 is connected to the terminal TBO (ground). The control circuit 6 performs a switch control similar the ninth embodiment shown in FIG. 18.

In the present embodiment, the advantageous effects similar to the fifth and ninth embodiments will be achieved.

Thirteenth Embodiment

A thirteenth embodiment will be described with reference to FIG. 23.

Figure 13:
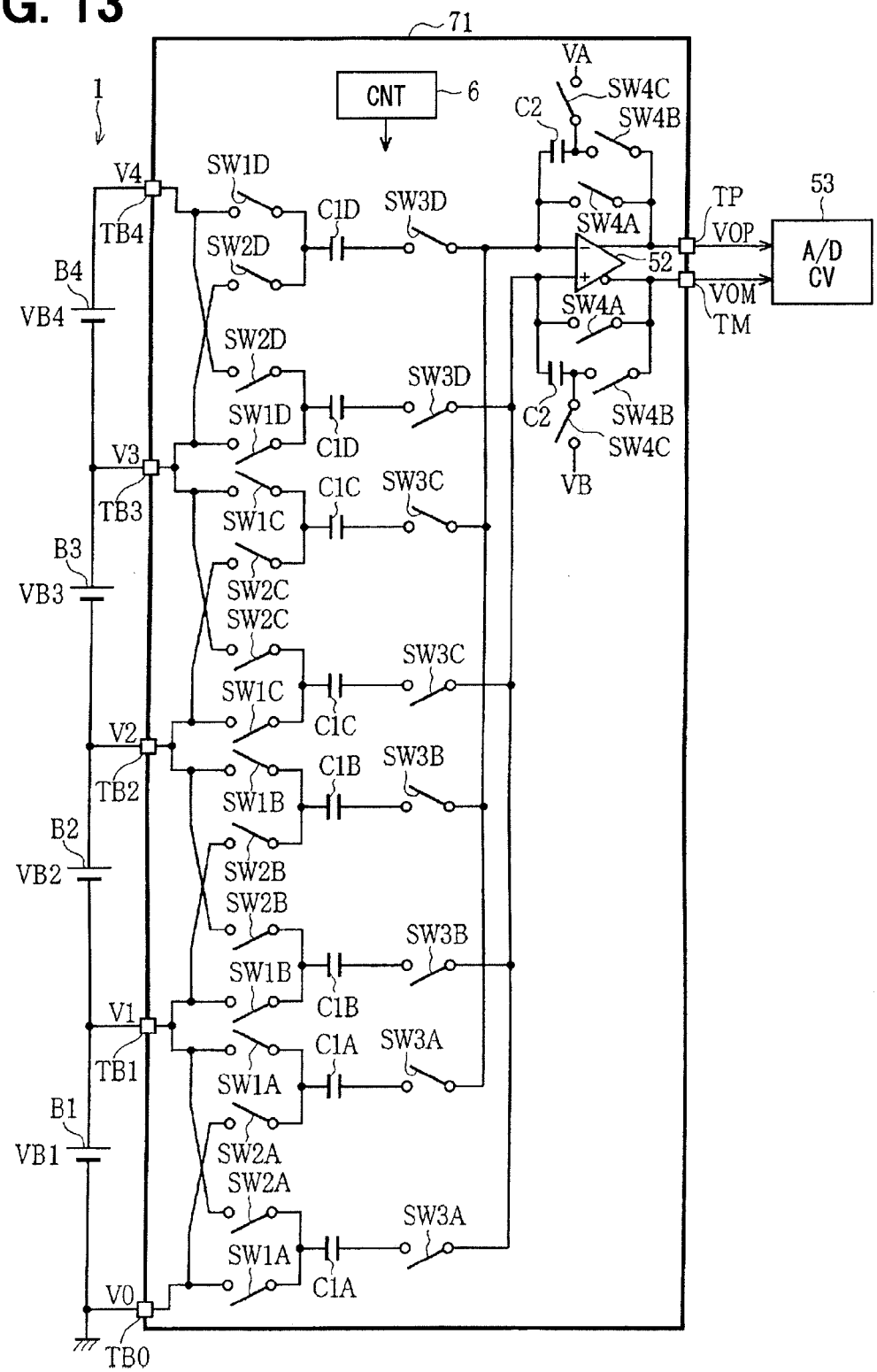
FIG. 13 is a schematic diagram of a voltage detecting device according to a sixth embodiment of the present disclosure.
Figure 23:
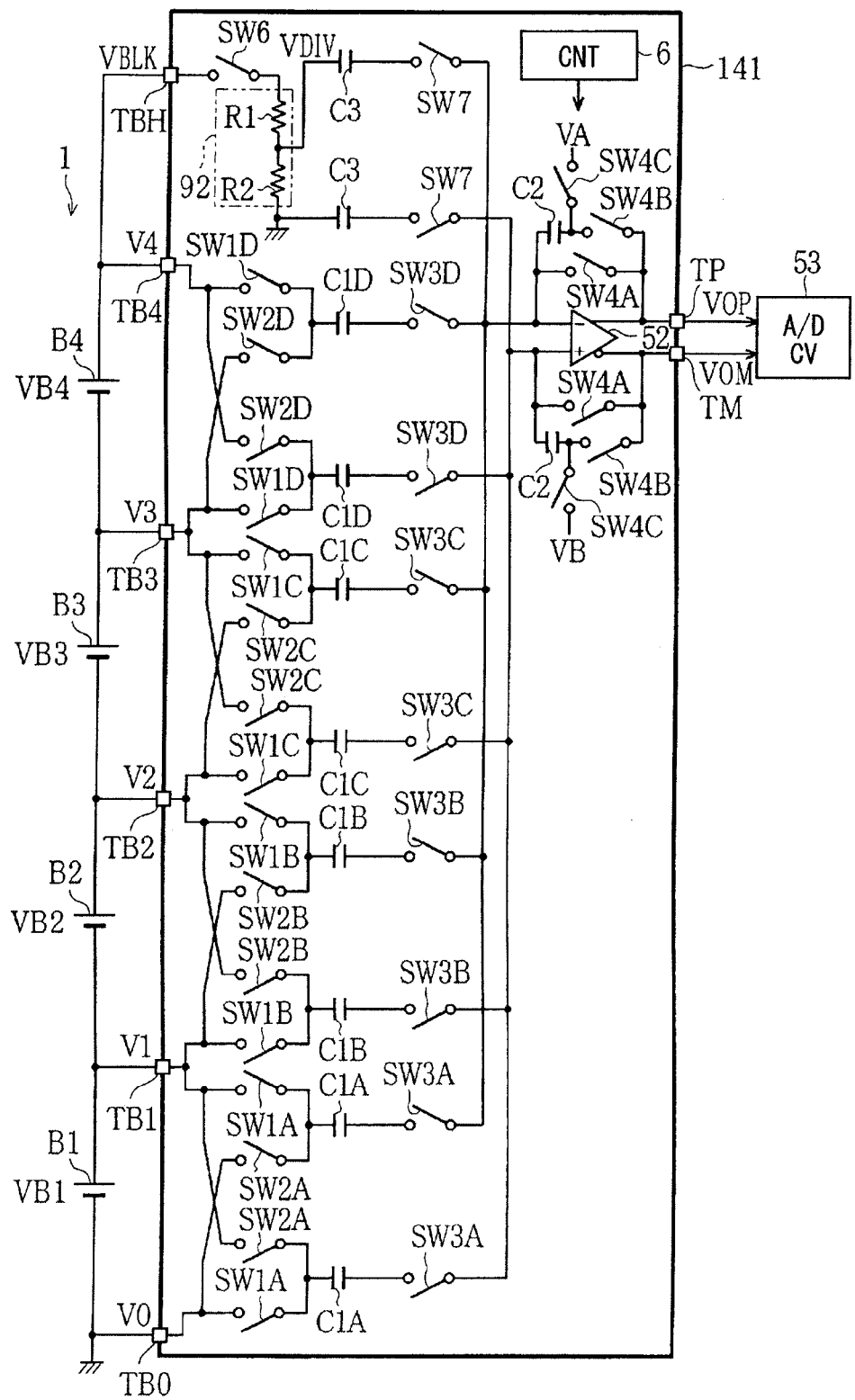
FIG. 23 is a schematic diagram of a voltage detecting device according to a thirteenth embodiment of the present disclosure.

As shown in FIG. 23, a voltage detecting device 141 is provided by modifying the structure shown in FIG. 19 for detecting the divided voltage VDIV of the assembled battery 1 into a differential type and adding the modified structure to the voltage detecting device 71 shown in FIG. 13. The control circuit 6 performs a switch control similar to the tenth embodiment shown in FIG. 20.

In the present embodiment, the advantageous effects similar to the sixth and tenth embodiments will be achieved.

Fourteenth Embodiment

A fourteenth embodiment will be described with reference to FIG. 24.

Figure 14:
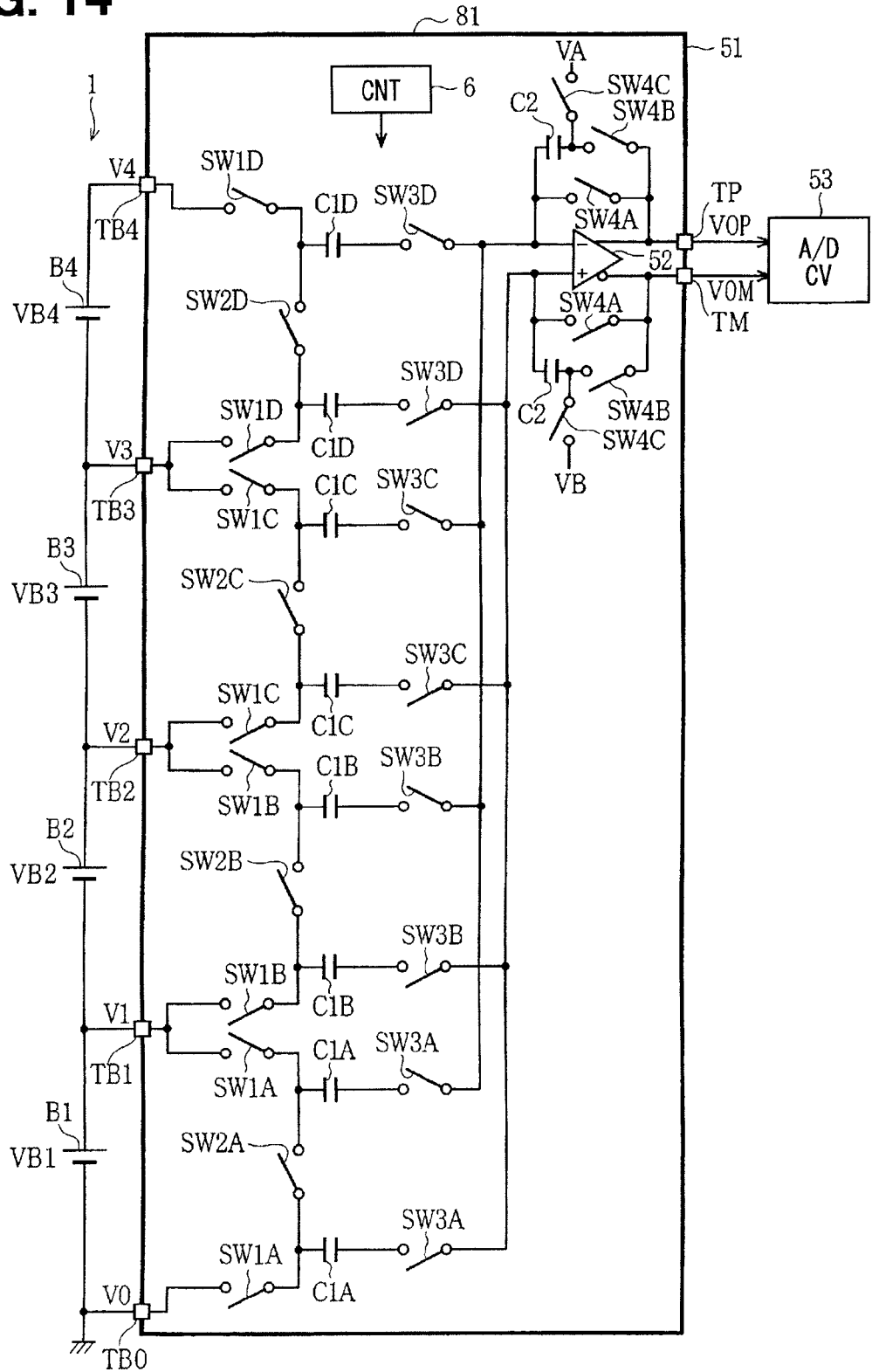
FIG. 14 is a schematic diagram of a voltage detecting device according to a seventh embodiment of the present disclosure.
Figure 24:
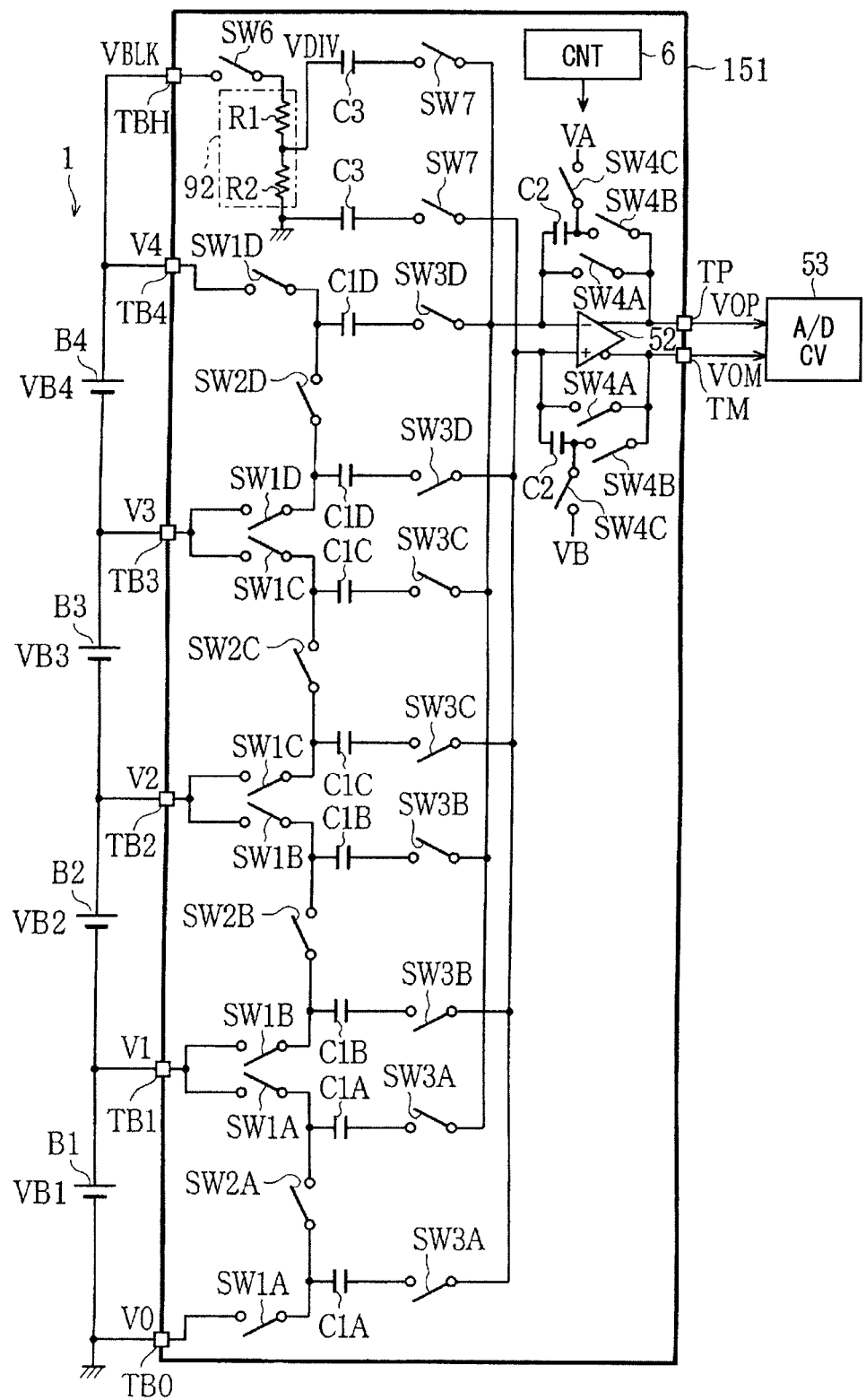
FIG. 24 is a schematic diagram of a voltage detecting device according to a fourteenth embodiment of the present disclosure.

As shown in FIG. 24, a voltage detecting device 151 is provided by modifying the structure shown in FIG. 19 for detecting the divided voltage VDIV of the assembled battery 1 into a differential type and adding the modified structure to the voltage detecting device 81 shown in FIG. 14. The control circuit 6 performs a switch control similar to the tenth embodiment shown in FIG. 20.

In the present embodiment, the advantageous effects similar to the seventh and tenth embodiments will be achieved.

Other Embodiments

The exemplary embodiments of the present disclosure are described hereinabove. However, the present disclosure may not be limited to the exemplary embodiments described hereinabove, but may be modified in various other ways without departing from the gist of the present disclosure.

In each of the embodiments described above, the electric charge of the second capacitor C2 is reset by turning on the fourth switch SW4, the fourth-A switch SW4A, or the fourth-C switch SW4C in the period 1 where the first capacitors C1x are simultaneously charged. Therefore, a resetting process of the electric charge of the second capacitor C2 can be deleted for the battery cell B4 that is set to the target cell for detecting the voltage firstly after the holding of the electric charge, or for the entire assembled battery 1. In place of the above operation, that is, in place of resetting the electric charge of the second capacitor C2 in the period 1, the resetting period similar to the period 5, 8, 11, 14 may be provided between the period 1 and the period 2.

The specified voltage may be set to a voltage different from the reference voltage VREF as long as a differential voltage with the reference voltage VREF is equal to or lower than the withstand voltage of the switches SW3x, SW5x, SW7 and SW8.

In the first and fourth embodiments, it is not always necessary to turn off the second switch SW2x corresponding to the target cell and to turn on the first switch SW1x and the fifth switch SW5x corresponding to the target cell, immediately after the period 4, period 7 and period 10. These switch operations may be performed at least before the beginning of the next period 1, which is the next simultaneous sampling period. This may be similarly adoptable to the eighth embodiment and to the eleventh embodiment.

In the second, third, fifth, sixth and seventh embodiments, it is not always necessary to turn off the second switch SW2x corresponding to the target cell immediately after the period 4, the period 7 and the period 10. Further, it is not always necessary to immediately turn off the third switch SW3x, as long as the first switch SW1x and the second switch SW2x are turned off. These switch operation may be adoptable to the ninth, tenth, twelfth, thirteenth and fourteenth embodiments.

After the simultaneous holding (sampling) of the electric charge in the first capacitors C1A to C1D, the detection of the cell voltage VBn using the electric charge held may be performed in arbitrary order. Likewise, after the simultaneous holding (sampling) of the electric charge in the first capacitors C1A to C1D and the third capacitor C3, the detection of the divided voltage VDIV and the cell voltage VBn using the electric charge may be performed in arbitrary order.

Summarizing the embodiments, the voltage detecting device is configured to detect the voltage of each of the plurality of unit batteries B1 to B4 of the assembled battery 1 connected in series. The voltage detecting device may include an operation amplifier having an inverted input terminal and a non-inverted input terminal; a plurality of first capacitors being correspondingly provided for the plurality of unit batteries; a plurality of first switches each being disposed between a high potential terminal of corresponding one of the unit batteries and a first end of corresponding one of the first capacitors; a plurality of second switches each being disposed between a low potential terminal of corresponding one of the unit batteries and the first end of corresponding one of the first capacitors, the low potential terminal having a potential lower than that of the high potential terminal; a plurality of third switches each being disposed between the inverted input terminal of the operation amplifier and a second end of corresponding one of the first capacitors; a second capacitor and a fourth switch being disposed in parallel between the inverted input terminal of the operation amplifier and an output terminal of the operation amplifier; a plurality of fifth switches each being disposed between a voltage line and the second end of corresponding one of the first capacitors, the voltage line being applied with a specified voltage; and a control unit controlling the first switches, the second switches, the third switches, the fourth switch and the fifth switches to detect the voltage of each of the unit batteries. In this case, the control unit may close the first switches and the fifth switches to charge electric charge to the first capacitors and then simultaneously open at least one of the first switches or the fifth switches to hold the electric charge in the first capacitors. Thereafter, while selecting one of the unit batteries in a predetermined order as a target unit battery for voltage detection, the control unit may temporarily close the fourth switch to reset electric charge of the second capacitor, and close one of the second switches corresponding to the target unit battery and one of the third switches corresponding to the target unit battery, in a state where one of the first switches corresponding to the target unit battery and one of the fifth switches corresponding to the target unit battery are opened, to detect the voltage of the target unit battery.

In this case, the electric charge of the unit batteries is sampled at the same time, and then the voltages of the unit batteries are detected in a predetermined order using the electric charge sampled. Therefore, the time of measuring the internal resistance and the terminal open circuit voltage of the unit batteries can be shortened, as compared with a conventional structure. Also a circuit for the operation amplifier and the switches may be provided by a low withstand voltage transistor, and a layout area can be reduced.

The operation amplifier may be a single-end operation amplifier. In this case, the non-inverted input terminal of the operation amplifier may be biased to a predetermined reference voltage, and the specified voltage of the voltage line may be specified so that a voltage difference between the reference voltage and the specified voltage is equal to or less than a withstand voltage of the fifth switch.

The voltage detecting device may detect a divided voltage of the entire voltage of the assembled battery in addition to the voltage detection of each of the unit batteries. In this case, the voltage detecting device may further include: a sixth switch and a voltage-dividing circuit being disposed in series to each other, between a high potential terminal of the assembled battery and a low potential terminal of the assembled battery, the low potential terminal of the assembled battery having a potential lower than that of the high potential terminal of the assembled battery; a third capacitor having a first end connected to a voltage-dividing node of the voltage-dividing circuit; a seventh switch being disposed between the inverted input terminal of the operation amplifier and a second end of the third capacitor; and an eighth switch disposed between the voltage line applied with the specified voltage and the second end of the third capacitor.

In this case, when the control unit closes the first switches and the fifth switches to charge the electric charge to the first capacitors, the control unit may also close the sixth switch and the eighth switch to charge electric charge to the third capacitor. Further, when the control unit simultaneously opens the at least one of the first switches or the fifth switches to hold the electric charge in the first capacitors, the control unit may also open the eighth switch to hold the electric charge in the third capacitor. After the electric charge of the second capacitor is reset, the control unit may close the seventh switch in a state where the sixth switch and the eighth switch are opened, and detect a divided voltage of an entire voltage of the assembled battery.

In this case, the voltage detecting device can sample the voltages of the unit batteries and the divided voltage of the assembled battery at the same time, and then the divided voltage and the assembled battery and the voltages of the unit batteries are detected in a predetermined order using the sampled electric charge. Therefore, diagnose of the voltage detecting device can be accurately performed based on comparison of the total voltage of the detected voltages of the unit batteries and the voltage of the entire assembled battery.

The voltage detecting device may be configured as a full differential structure, and the operation amplifier may be a differential output operation amplifier, in place of the single-end operation amplifier. The differential output operation amplifier may have a common voltage as a reference voltage. In this case, the first switches, the second switches, the third switches, the fourth switch, the fifth switches, the first capacitors and the second capacitor may be included in a first side circuit unit provided on a first side of the operation amplifier corresponding to the inverted input terminal and a non-inverted output terminal of the operation amplifier. Further, the voltage detecting device may further include a second side circuit unit provided on a second side of the operation amplifier corresponding to the non-inverted input terminal and an inverted output terminal of the operation amplifier. The second side circuit unit includes the first switches, the second switches, the third switches, the fourth switch and the fifth switches, the first capacitors and the second capacitor. In the first side circuit unit, the second capacitor and the fourth switch are disposed in parallel between the inverted input terminal of the operation amplifier and the non-inverted output terminal of the operation amplifier. In the second side circuit unit, each of the first switches is disposed between the low potential terminal of corresponding one of the unit batteries and the first end of corresponding one of the first capacitors; each of the second switches is disposed between the high potential terminal of corresponding one of the unit batteries and the first end of corresponding one of the first capacitors; each of the third switches is disposed between the non-inverted input terminal of the operation amplifier and the second end of corresponding one of the first capacitors; the second capacitor and the fourth switch are disposed in parallel between the non-inverted input terminal of the operation amplifier and the inverted output terminal of the operation amplifier; and each of the fifth switches is disposed between the voltage line applied with the specified voltage and the second end of corresponding one of the first capacitors.

In this case, even if common mode noise overlaps on the assembled battery in the charging of the first capacitors where the first switches and the fifth switches are closed or in the electric charge redistribution where the second switches are closed, the common mode noise can be removed from the output voltage of the operation amplifier. Further, since the circuit has a symmetric structure, an error due to field through, which occurs when the switches are operated, can be cancelled. Therefore, the detection accuracy improves.

Also in this case, the full differential-type voltage detecting device may be configured to detect the divided voltage of the assembled battery together with the voltage detection of the unit batteries.

In the voltage detecting device, the fifth switches may be deleted. Namely, a voltage detecting device may include the operation amplifier, the plurality of first capacitors, the plurality of first switches, the plurality of second switches, the plurality of third switches, the second capacitor, the fourth switch, and the control unit. In this case, the control unit may close the first switches and the third switches to charge electric charge to the first capacitors, in a state where the fourth switch is closed and the operation amplifier is operated in a voltage follower, and simultaneously open at least one of the first switches or the third switches to hold the electric charge in the first capacitors. Then, while selecting one of the unit batteries in a predetermined order as a target unit battery for voltage detection, the control unit may temporarily close the fourth switch to reset electric charge of the second capacitor, and close one of the second switches corresponding to the target unit battery and one of the third switches corresponding to the target unit battery, in a state where one of the first switches corresponding to the target unit battery is opened, to detect the voltage of the target unit battery. Also in this case, the similar advantageous effects described hereinabove will be achieved. Also, since the fifth switches are unnecessary, the layout area can be reduced.

Also in this voltage detecting device, the operation amplifier may be a single-end operation amplifier. Alternatively, the voltage detecting device may be configured into a full-differential structure and the operation amplifier may be a differential output operation amplifier. Further, the voltage detecting device may be configured to detect the divided-voltage of the entire voltage of the assembled battery in addition to the voltage detection of each of the unit batteries The voltage detecting device may include an operation amplifier having an inverted input terminal and a non-inverted input terminal; a plurality of first capacitors being correspondingly provided for the plurality of unit batteries; a plurality of first switches each being disposed between a high potential terminal of corresponding one of the unit batteries and a first end of corresponding one of the first capacitors; a plurality of second switches each being disposed between a low potential terminal of corresponding one of the unit batteries and the first end of corresponding one of the first capacitors, the low potential terminal having a potential lower than that of the high potential terminal; a plurality of third switches each being disposed between the inverted input terminal of the operation amplifier and a second end of corresponding one of the first capacitors; a fourth switch being disposed between the inverted input terminal of the operation amplifier and an output terminal of the operation amplifier; a second capacitor and a ninth switch being disposed in series, between the inverted input terminal of the operation amplifier and the output terminal of the operation amplifier; a tenth switch being disposed between a common connecting point of the second capacitor and the ninth switch and a voltage line applied with a constant voltage; and a control unit controlling the first switches, the second switches, the third switches, the fourth switch, the ninth switch and the tenth switch to detect the voltage of each of the unit batteries. The control unit closes the first switches and the third switches to charge electric charge to the first capacitors, in a state where the fourth switch is closed and the operation amplifier is operated in a voltage follower, and simultaneously opens at least one of the first switches or the third switches to hold the electric charge in the first capacitors. Then, while selecting one of the unit batteries in a predetermined order as a target unit battery for voltage detection, the control unit temporarily closes the fourth switch and the tenth switch to reset electric charge of the second capacitor; and closes the ninth switch, one of the second switches corresponding to the target unit battery, and one of the third switches corresponding to the target unit battery, in a state where one of the first switches corresponding to the target unit battery is opened, to detect the voltage of the target unit battery.

In this case, the advantageous effects described hereinabove will be also achieved. Further, the offset voltage of the operation amplifier can be removed from the detected voltage of the unit batteries.

Also in this voltage detecting device, the operation amplifier may be a single-end operation amplifier. Alternatively, the voltage detecting device may be configured into a full differential structure, and the operation amplifier may be a differential output operation amplifier. In this case, the voltage detecting device may have the first side circuit unit and the second side circuit unit. However, the first side circuit unit and the second side circuit unit may share the second switches between them. Each of the second switches may be disposed between the first end of corresponding one of the first capacitors of the first side circuit unit and the first end of corresponding one of the first capacitors of the second side circuit unit.

In this case, the first end of the first capacitor may be separated from the assembled battery and becomes a floating condition, during the redistribution of the electric charge. Therefore, even if common mode noise overlaps on the assembled battery during the charging of the first capacitor by closing the first switch or during the redistribution of the electric charge by closing the second switch, the effect of the common mode noise can be removed from the common voltage of the input terminal of the operation amplifier.

Also in this case, the voltage detecting device may be configured to detect the divided voltage of the assembled battery together with the voltage detection of the unit batteries In the voltage detecting device described in the above embodiments, the control unit may omit resetting of the electric charge of the second capacitor for a first target unit battery that is selected first after the electric charge is simultaneously held in the first capacitors, on condition that the fourth switch is closed in a period where the electric charge is simultaneously charged in the first capacitors. The control unit may omit resetting of the electric charge of the second capacitor for a first target unit battery that is selected first after the electric charge is simultaneously held in the first capacitors and the third capacitors, on condition that the fourth switch is closed in a period where the electric charge is simultaneously charged in the first capacitors and the third capacitors. The control unit may omit resetting of the electric charge of the second capacitor for a first target unit battery that is selected first after the electric charge is simultaneously held in the first capacitors, on condition that the fourth switch and the tenth switch are closed in a period where the electric charge is simultaneously charged in the first capacitors. The control unit may omit resetting of the electric charge of the second capacitor for a first target unit battery that is selected first after the electric charge is simultaneously held in the first capacitors and the third capacitors, on condition that the fourth switch and the tenth switch are closed in a period where the electric charge is simultaneously charged in the first capacitors and the third capacitors. In these cases, the time for the voltage detection can be shortened.

In the voltage detecting device having the sixth switch and the voltage-dividing circuit, the control unit may compare a total voltage of the voltages detected for the plurality of unit batteries with an entire voltage of the assembled voltage obtained from the divided voltage detected, and may determine a malfunction of the voltage detecting device. In this case, even if the fluctuation of the battery voltage is large, the malfunction can be accurately determined.

The above described structures may be combined in any ways. While only the selected exemplary embodiment and examples have been chosen to illustrate the present disclosure, it will be apparent to those skilled in the art from this disclosure that various changes and modifications can be made therein without departing from the scope of the disclosure as defined in the appended claims. Furthermore, the foregoing description of the exemplary embodiment and examples according to the present disclosure is provided for illustration only, and not for the purpose of limiting the disclosure as defined by the appended claims and their equivalents.

What is claimed is:

1. A voltage detecting device for detecting a voltage of each of a plurality of unit batteries of an assembled battery, the unit batteries being connected in series, the voltage detecting device comprising:

an operation amplifier having an inverted input terminal and a non-inverted input terminal;

a plurality of first capacitors being correspondingly provided for the plurality of unit batteries;

a plurality of first switches each being disposed between a high potential terminal of corresponding one of the unit batteries and a first end of corresponding one of the first capacitors;

a plurality of second switches each being disposed between a low potential terminal of corresponding one of the unit batteries and the first end of corresponding one of the first capacitors, the low potential terminal having a potential lower than that of the high potential terminal;

a plurality of third switches each being disposed between the inverted input terminal of the operation amplifier and a second end of corresponding one of the first capacitors;

a second capacitor and a fourth switch being disposed in parallel between the inverted input terminal of the operation amplifier and an output terminal of the operation amplifier;

a plurality of fifth switches each being disposed between a voltage line and the second end of corresponding one of the first capacitors, the voltage line being applied with a specified voltage; and a control unit being connected to the first switches, the second switches, the third switches, the fourth switch and the fifth switches and configured to detect the voltage of each of the unit batteries while the first capacitors simultaneously hold an electric charge, wherein the control unit includes a configuration that:
closes the first switches and the fifth switches to charge the electric charge to the first capacitors;
simultaneously opens all switches selected from a group consisting of all the first switches, all the fifth switches and all of both the first and fifth switches to hold the electric charge in the first capacitors;
temporarily closes the fourth switch to reset electric charge of the second capacitor, while selecting one of the unit batteries in a predetermined order as a target unit battery for voltage detection; and
closes one of the second switches corresponding to the target unit battery and one of the third switches corresponding to the target unit battery, in a state where one of the first switches corresponding to the target unit battery and one of the fifth switches corresponding to the target unit battery are opened, to detect the voltage of the target unit battery.

2. The voltage detecting device according to claim 1, wherein
the operation amplifier is a single-end operation amplifier,
the non-inverted input terminal of the operation amplifier is biased to a predetermined reference voltage, and
the specified voltage of the voltage line is specified so that a voltage difference between the reference voltage and the specified voltage is equal to or less than a withstand voltage of the fifth switch.

3. The voltage detecting device according to claim 2, further comprising:
a sixth switch and a voltage-dividing circuit being disposed in series to each other, between a high potential terminal of the assembled battery and a low potential terminal of the assembled battery, the low potential terminal of the assembled battery having a potential lower than that of the high potential terminal of the assembled battery;
a third capacitor having a first end connected to a voltage-dividing node of the voltage-dividing circuit;
a seventh switch being disposed between the inverted input terminal of the operation amplifier and a second end of the third capacitor; and
an eighth switch disposed between the voltage line applied with the specified voltage and the second end of the third capacitor, wherein
when the control unit closes the first switches and the fifth switches to charge the electric charge to the first capacitors, the control unit also closes the sixth switch and the eighth switch to charge electric charge to the third capacitor,
when the control unit simultaneously opens all switches selected from a group consisting of all the fifth switches and a group consisting of all the first and fifth switches to hold the electric charge in the first capacitors, the control unit also opens the eighth switch to hold the electric charge in the third capacitor, and
after the electric charge of the second capacitor is reset, the control unit closes the seventh switch in a state where the sixth switch and the eighth switch are opened, and detects a divided voltage of an entire voltage of the assembled battery.

4. The voltage detecting device according to claim 1, the voltage detecting device being configured into a full differential structure, wherein
the operation amplifier is a differential output operation amplifier,
the first switches, the second switches, the third switches, the fourth switch, the fifth switches, the first capacitors and the second capacitor are included in a first side circuit unit provided on a first side of the operation amplifier corresponding to the inverted input terminal and a non-inverted output terminal of the operation amplifier,
the voltage detecting device further comprising a second side circuit unit provided on a second side of the operation amplifier corresponding to the non-inverted input terminal and an inverted output terminal of the operation amplifier, the second side circuit unit including the first switches, the second switches, the third switches, the fourth switch and the fifth switches, the first capacitors and the second capacitor, wherein
in the first side circuit unit, the second capacitor and the fourth switch are disposed in parallel between the inverted input terminal of the operation amplifier and the non-inverted output terminal of the operation amplifier,
in the second side circuit unit, each of the first switches is disposed between the low potential terminal of corresponding one of the unit batteries and the first end of corresponding one of the first capacitors, each of the second switches is disposed between the high potential terminal of corresponding one of the unit batteries and the first end of corresponding one of the first capacitors, each of the third switches is disposed between the non-inverted input terminal of the operation amplifier and the second end of corresponding one of the first capacitors, the second capacitor and the fourth switch are disposed in parallel between the non-inverted input terminal of the operation amplifier and the inverted output terminal of the operation amplifier, and each of the fifth switches is disposed between the voltage line applied with the specified voltage and the second end of corresponding one of the first capacitors.

5. The voltage detecting device according to claim 4, further comprising:
a sixth switch and a voltage-dividing circuit being disposed in series to each other, between a high potential terminal of the assembled battery and a low potential terminal of the assembled battery, the low potential terminal of the assembled battery having a potential lower than that of the high potential terminal of the assembled battery; and
a third capacitor, a seventh switch and an eighth switch included in each of the first side circuit unit and the second side circuit unit, wherein
in the first side circuit unit, the third capacitor has a first end connected to a voltage dividing node of the voltage-dividing circuit, the seventh switch is disposed between the inverted input terminal of the operation amplifier and a second end of the third capacitor, and the eighth switch is disposed between the voltage line applied with the specified voltage and the second end of the third capacitor,
in the second side circuit unit, the third capacitor has a first end connected to the low potential terminal of the assembled battery, the seventh switch is disposed between the non-inverted input terminal of the operation amplifier and a second end of the third capacitor, and the eighth switch is disposed between the voltage line applied with the specified voltage and the second end of the third capacitor,
when the control unit closes the first switches and the fifth switches to charge the electric charge to the first capacitors, the control unit also closes the sixth switches and the eighth switches to charge electric charge to the third capacitors,
when the control unit simultaneously opens all switches selected from a group consisting of all the fifth switches and a group consisting of all the first and fifth switches to hold the electric charge in the first capacitors, the control unit also opens the eighth switches to hold the electric charge in the third capacitors, and
after the electric charge of the second capacitors is reset, the control unit closes the seventh switches in a state where the sixth switches and the eighth switches are opened, and detects a divided voltage of an entire voltage of the assembled battery.

6. The voltage detecting device according to claim 1, wherein

29 the control unit omits resetting of the electric charge of the second capacitor for a first target unit battery that is selected first after the electric charge is simultaneously held in the first capacitors, on condition that the fourth switch is closed in a period where the electric charge is simultaneously charged in the first capacitors.

7. The voltage detecting device according to claim 3, wherein the control unit omits resetting of the electric charge of the second capacitor for a first target unit battery that is selected first after the electric charge is simultaneously held in the first capacitors and the third capacitors, on condition that the fourth switch is closed in a period where the electric charge is simultaneously charged in the first capacitors and the third capacitors.

8. The voltage detecting device according to claim 2, wherein the specified voltage is set equal to the reference voltage.

9. The voltage detecting device according to claim 3, wherein the control unit compares a total voltage of the voltages detected for the plurality of unit batteries with an entire voltage of the assembled voltage obtained from the divided voltage detected, and determines a malfunction of the voltage detecting device.

10. The voltage detecting device according to claim 1, wherein after closure of the first switches and the fifth switches to charge the electric charge to the first capacitors, in a state where the fourth switch is closed and the operation amplifier is operated in a voltage follower, the control unit simultaneously opens all switches selected from a group consisting of all the fifth switches and all of both the first and fifth switches to hold the electric charge in the first capacitors.

11. A voltage detecting device for detecting a voltage of each of a plurality of unit batteries of an assembled battery, the unit batteries being connected in series, the voltage detecting device comprising:

an operation amplifier having an inverted input terminal and a non-inverted input terminal;

a plurality of first capacitors being correspondingly provided for the plurality of unit batteries;

a plurality of first switches each being disposed between a high potential terminal of corresponding one of the unit batteries and a first end of corresponding one of the first capacitors;

a plurality of second switches each being disposed between a low potential terminal of corresponding one of the unit batteries and the first end of corresponding one of the first capacitors, the low potential terminal having a potential lower than that of the high potential terminal;

a plurality of third switches each being disposed between the inverted input terminal of the operation amplifier and a second end of corresponding one of the first capacitors;

a second capacitor and a fourth switch being disposed in parallel between the inverted input terminal of the operation amplifier and an output terminal of the operation amplifier; and a control unit being connected to the first switches, the second switches, the third switches, and the fourth switch and configured to detect the voltage of each of the unit batteries while the first capacitors simultaneously hold an electric charge, wherein

30 the control unit includes a configuration that:

closes the first switches and the third switches to charge the electric charge to the first capacitors, in a state where the fourth switch is closed and the operation amplifier is operated in a voltage follower;

simultaneously opens all switches selected from a group consisting of all the first switches, all the third switches and all of both the first and third switches to hold the electric charge in the first capacitors;

temporarily closes the fourth switch to reset electric charge of the second capacitor, while selecting one of the unit batteries in a predetermined order as a target unit battery for voltage detection; and closes one of the second switches corresponding to the target unit battery and one of the third switches corresponding to the target unit battery, in a state where one of the first switches corresponding to the target unit battery is opened, to detect the voltage of the target unit battery.

12. The voltage detecting device according to claim 11, wherein the operation amplifier is a single-end operation amplifier, and the non-inverted input terminal of the operation amplifier is biased to a predetermined reference voltage.

13. The voltage detecting device according to claim 12, further comprising:

a sixth switch and a voltage-dividing circuit being disposed in series to each other, between a high potential terminal of the assembled battery and a low potential terminal of the assembled battery, the low potential terminal of the assembled battery having a potential lower than that of the high potential terminal of the assembled battery;

a third capacitor having a first end connected to a voltage-dividing node of the voltage-dividing circuit; and a seventh switch being disposed between the inverted input terminal of the operation amplifier and a second end of the third capacitor, wherein when the control unit closes the first switches and the third switches to charge electric charge to the first capacitors in the state where the fourth switch is closed and the operation amplifier is operated in the voltage follower, the control unit also closes the sixth switch and the seventh switch to charge electric charge to the third capacitor, when the control unit simultaneously opens all switches selected from a group consisting of all the third switches and a group consisting of all the first and third switches to hold the electric charge in the first capacitors, the control unit also opens the seventh switch to hold the electric charge in the third capacitor, and after the electric charge of the second capacitor is reset, the control unit closes the seventh switch in a state where the sixth switch is opened, and detects a divided voltage of an entire voltage of the assembled battery.

14. The voltage detecting device according to claim 11, the voltage detecting device being configured into a full differential structure, wherein the operation amplifier is a differential output operation amplifier, the first switches, the second switches, the third switches, the fourth switch, the first capacitors, and the second capacitor are included in a first side circuit unit provided on a first side of the operation amplifier corresponding to the inverted input terminal and a non-inverted output terminal of the operation amplifier, the voltage detecting device further comprising a second side circuit unit provided on a second side of the operation amplifier corresponding to the non-inverted input terminal and an inverted output terminal of the operation amplifier, the second side circuit unit including the first switches, the second switches, the third switches, the fourth switch, the first capacitors and the second capacitor, wherein in the first side circuit unit, the second capacitor and the fourth switch are disposed in parallel between the inverted input terminal of the operation amplifier and the non-inverted output terminal of the operation amplifier, in the second side circuit unit, each of the first switches is disposed between the low potential terminal of corresponding one of the unit batteries and the first end of corresponding one of the first capacitors, each of the second switches is disposed between the high potential terminal of corresponding one of the unit batteries and the first end of corresponding one of the first capacitors, each of the third switches is disposed between the non-inverted input terminal of the operation amplifier and the second end of corresponding one of the first capacitors, the second capacitor and the fourth switch are disposed in parallel between the non-inverted input terminal of the operation amplifier and the inverted output terminal of the operation amplifier.

15. The voltage detecting device according to claim 14, further comprising:
- a sixth switch and a voltage-dividing circuit being disposed in series to each other, between a high potential terminal of the assembled battery and a low potential terminal of the assembled battery, the low potential terminal of the assembled battery having a potential lower than that of the high potential terminal of the assembled battery; and
- a third capacitor and a seventh switch being included in each of the first side circuit unit and the second side circuit unit, wherein
- in the first side circuit unit, the third capacitor has a first end connected to a voltage-dividing node of the voltage-dividing circuit, and the seventh switch is disposed between the inverted input terminal of the operation amplifier and a second end of the third capacitor,
- in the second side circuit unit, the third capacitor has a first end connected to the low potential terminal of the assembled battery, and the seventh switch is disposed between the non-inverted input terminal of the operation amplifier and a second end of the third capacitor,
- when the control unit closes the first switches and the third switches to charge electric charge to the first capacitors in the state where the fourth switches are closed and the operation amplifier is operated in the voltage follower, the control unit also closes the sixth switch and the seventh switches to charge electric charge to the third capacitors,
- when the control unit simultaneously opens all switches selected from a group consisting of all the third switches and a group consisting of all the first and third switches to hold the electric charge in the first capacitors, the control unit also opens the seventh switches to hold the electric charge in the third capacitors, and
- after the electric charge of the second capacitors is reset, the control unit closes the seventh switches in a state where the sixth switch is opened, and detects a divided voltage of an entire voltage of the assembled battery.

16. The voltage detecting device according to claim 11, wherein after closure of the first switches and the third switches to charge the electric charge to the first capacitors, in a state where the fourth switch is closed and the operation amplifier is operated in a voltage follower,
the control unit simultaneously opens all switches selected from a group consisting of all the third switches and all of both the first and third switches to hold the electric charge in the first capacitors.

17. A voltage detecting device for detecting a voltage of each of a plurality of unit batteries of an assembled battery, the unit batteries being connected in series, the voltage detecting device comprising:
- an operation amplifier having an inverted input terminal and a non-inverted input terminal;
- a plurality of first capacitors being correspondingly provided for the plurality of unit batteries;
- a plurality of first switches each being disposed between a high potential terminal of corresponding one of the unit batteries and a first end of corresponding one of the first capacitors;
- a plurality of second switches each being disposed between a low potential terminal of corresponding one of the unit batteries and the first end of corresponding one of the first capacitors, the low potential terminal having a potential lower than that of the high potential terminal;
- a plurality of third switches each being disposed between the inverted input terminal of the operation amplifier and a second end of corresponding one of the first capacitors;
- a fourth switch being disposed between the inverted input terminal of the operation amplifier and an output terminal of the operation amplifier;
- a second capacitor and a ninth switch being disposed in series, between the inverted input terminal of the operation amplifier and the output terminal of the operation amplifier;
- a tenth switch being disposed between a common connecting point of the second capacitor and the ninth switch and a voltage line applied with a constant voltage; and
- a control unit being connected to the first switches, the second switches, the third switches, the fourth switch, the ninth switch and the tenth switch and configured to detect the voltage of each of the unit batteries while the first capacitors simultaneously hold an electric charge, wherein
the control unit includes a configuration that:
- closes the first switches and the third switches to charge the electric charge to the first capacitors, in a state where the fourth switch is closed and the operation amplifier is operated in a voltage follower;
- simultaneously opens all switches selected from a group consisting of all the first switches, all the third switches and all of both the first and third switches to hold the electric charge in the first capacitors;
- temporarily closes the fourth switch and the tenth switch to reset electric charge of the second capacitor, while selecting one of the unit batteries in a predetermined order as a target unit battery for voltage detection; and
- closes the ninth switch, one of the second switches corresponding to the target unit battery, and one of the third switches corresponding to the target unit battery, in a state where one of the first switches corresponding to the target unit battery is opened, to detect the voltage of the target unit battery.

18. The voltage detecting device according to claim 17, wherein the operation amplifier is a single-end operation amplifier, and the non-inverted input terminal of the operation amplifier is biased to a predetermined reference voltage.

19. The voltage detecting device according to claim 18, further comprising:

a sixth switch and a voltage-dividing circuit being disposed in series to each other, between a high potential terminal of the assembled battery and a low potential terminal of the assembled battery, the low potential terminal of the assembled battery having a potential lower than that of the high potential terminal of the assembled battery;

a third capacitor having a first end connected to a voltage-dividing node of the voltage-dividing circuit; and a seventh switch being disposed between the inverted input terminal of the operation amplifier and a second end of the third capacitor, wherein when the control unit closes the first switches and the third switches to charge the electric charge to the first capacitors in the state where the fourth switch is closed and the operation amplifier is operated in the voltage follower, the control unit also closes the sixth switch and the seventh switch to charge electric charge to the third capacitor, when the control unit simultaneously opens all switches selected from a group consisting of all the third switches and a group consisting of all the first and third switches to hold the electric charge in the first capacitors, the control unit also opens the seventh switch to hold the electric charge in the third capacitor, and after the electric charge of the second capacitor is reset in a state where the fourth switch and the tenth switch are temporarily closed, the control unit closes the seventh switch in a state where the ninth switch is closed and the sixth switch is opened, and detects a divided voltage of an entire voltage of the assembled battery.

20. The voltage detecting device according to claim 17, the voltage detecting device being configured into a full differential structure, wherein the operation amplifier is a differential output operation amplifier, the first switches, the second switches, the third switches, the fourth switch, the ninth switch, the tenth switch, the first capacitors, and the second capacitor are included in a first side circuit unit provided on a first side of the operation amplifier corresponding to the inverted input terminal and a non-inverted output terminal of the operation amplifier, the voltage detecting device further comprising a second side circuit unit provided on a second side of the operation amplifier corresponding to the non-inverted input terminal and an inverted output terminal of the operation amplifier, the second side circuit unit including the first switches, the second switches, the third switches, the fourth switch, the ninth switch, the tenth switch, the first capacitors and the second capacitor, wherein in the first side circuit unit, the fourth switch is disposed between the inverted input terminal of the operation amplifier and the non-inverted output terminal of the operation amplifier, the second capacitor and the ninth switch are disposed in series between the inverted input terminal of the operation amplifier and the non-inverted output terminal of the operation amplifier, in the second side circuit unit, each of the first switches is disposed between the low potential terminal of corresponding one of the unit batteries and the first end of corresponding one of the first capacitors, each of the second switches is disposed between the high potential terminal of corresponding one of the unit batteries and the first end of corresponding one of the first capacitors, each of the third switches is disposed between the non-inverted input terminal of the operation amplifier and the second end of corresponding one of the first capacitor, the fourth switch is disposed between the non-inverted input terminal of the operation amplifier and the inverted output terminal of the operation amplifier, the second capacitor and the ninth switch are disposed in series between the non-inverted input terminal of the operation amplifier and the inverted output terminal of the operation amplifier, and the tenth switch is disposed between the common connecting point of the second capacitor and the ninth switch and the voltage line applied with the constant voltage.

21. The voltage detecting device according to claim 17, the voltage detecting device being configured into a full differential structure, wherein the operation amplifier is a differential output operation amplifier, the first switches, the second switches, the third switches, the fourth switch, the ninth switch, the tenth switch, the first capacitors, and the second capacitor are included in a first side circuit unit on a first side of the operation amplifier corresponding to the inverted input terminal and a non-inverted output terminal of the operation amplifier, the voltage detecting device further comprising a second side circuit unit provided on a second side of the operation amplifier corresponding to the non-inverted input terminal and an inverted output terminal of the operation amplifier, the second side circuit unit including the first switches, the third switches, the fourth switch, the ninth switch, the tenth switch, the first capacitors and the second capacitor, wherein in the first side circuit unit, the fourth switch is disposed between the inverted input terminal of the operation amplifier and the non-inverted output terminal of the operation amplifier, the second capacitor and the ninth switch are disposed in series between the inverted input terminal of the operation amplifier and the non-inverted output terminal of the operation amplifier, in the second side circuit unit, each of the first switches is disposed between the low potential terminal of corresponding one of the unit batteries and the first end of corresponding one of the first capacitors, each of the third switches is disposed between the non-inverted input terminal of the operation amplifier and the second end of corresponding one of the first capacitors, the fourth switch is disposed between the non-inverted input terminal of the operation amplifier and the inverted output terminal of the operation amplifier, the second capacitor and the ninth switch are disposed in series between the non-inverted input terminal of the operation amplifier and the inverted output terminal of the operation amplifier, and the tenth switch is disposed between the common connecting point of the second capacitor and the ninth switch and the voltage line applied with the constant voltage, and the first side circuit unit and the second side circuit unit share the second switches, and each of the second switches is disposed between the first end of corresponding one of the first capacitors of the first side circuit unit and the first end of corresponding one of the first capacitors of the second side circuit unit.

22. The voltage detecting device according to claim 21, further comprising:
a sixth switch and a voltage-dividing circuit being disposed in series to each other, between a high potential terminal of the assembled battery and a low potential terminal of the assembled battery, the low potential terminal of the assembled battery having a potential lower than that of the high potential terminal of the assembled battery; and
a third capacitor and a seventh switch being included in each of the first side circuit unit and the second side circuit unit, wherein
in the first side circuit unit, the third capacitor has a first end connected to a voltage-dividing node of the voltage-dividing circuit, and the seventh switch is disposed between the inverted input terminal of the operation amplifier and a second end of the third capacitor,
in the second side circuit unit, the third capacitor has a first end connected to the low potential terminal of the assembled battery, and the seventh switch is disposed between the non-inverted input terminal of the operation amplifier and a second end of the third capacitor,
when the control unit closes the first switches and the third switches to charge electric charge to the first capacitors in the state where the fourth switches are closed and the operation amplifier is operated in the voltage follower, the control unit also closes the sixth switch and the seventh switches to charge electric charge to the third capacitors,
when the control unit simultaneously opens all switches selected from a group consisting of all the third switches and a group consisting of all the first and third switches to hold the electric charge in the first capacitors, the control unit also opens the seventh switches to hold the electric charge in the third capacitors, and
after the electric charge of the second capacitors is reset in the state where the fourth switches and the tenth switches are temporarily closed, the control unit closes the seventh switches in a state where the ninth switches are closed and the sixth switch is opened, and detects a divided voltage of an entire voltage of the assembled battery.

23. The voltage detecting device according to claim 20, further comprising:
a sixth switch and a voltage-dividing circuit being disposed in series to each other, between a high potential terminal of the assembled battery and a low potential terminal of the assembled battery, the low potential terminal of the assembled battery having a potential lower than that of the high potential terminal of the assembled battery; and
a third capacitor and a seventh switch being included in each of the first side circuit unit and the second side circuit unit, wherein
in the first side circuit unit, the third capacitor has a first end connected to a voltage-dividing node of the voltage-dividing circuit, and the seventh switch is disposed between the inverted input terminal of the operation amplifier and a second end of the third capacitor,
in the second side circuit unit, the third capacitor has a first end connected to the low potential terminal of the assembled battery, and the seventh switch is disposed between the non-inverted input terminal of the operation amplifier and a second end of the third capacitor,
when the control unit closes the first switches and the third switches to charge electric charge to the first capacitors in the state where the fourth switches are closed and the operation amplifier is operated in the voltage follower, the control unit also closes the sixth switch and the seventh switches to charge electric charge to the third capacitors,
when the control unit simultaneously opens all switches selected from a group consisting of all the third switches and a group consisting of all the first and third switches to hold the electric charge in the first capacitors, the control unit also opens the seventh switches to hold the electric charge in the third capacitors, and
after the electric charge of the second capacitors is reset in the state where the fourth switches and the tenth switches are temporarily closed, the control unit closes the seventh switches in a state where the ninth switches are closed and the sixth switch is opened, and detects a divided voltage of an entire voltage of the assembled battery.

24. The voltage detecting device according to claim 17, wherein
the control unit omits resetting of the electric charge of the second capacitor for a first target unit battery that is selected first after the electric charge is simultaneously held in the first capacitors, on condition that the fourth switch and the tenth switch are closed in a period where the electric charge is simultaneously charged in the first capacitors.

25. The voltage detecting device according to claim 19, wherein
the control unit omits resetting of the electric charge of the second capacitor for a first target unit battery that is selected first after the electric charge is simultaneously held in the first capacitors and the third capacitors, on condition that the fourth switch and the tenth switch are closed in a period where the electric charge is simultaneously charged in the first capacitors and the third capacitors.

26. The voltage detecting device according to claim 17, wherein after closure of the first switches and the third switches to charge the electric charge to the first capacitors, in a state where the fourth switch is closed and the operation amplifier is operated in a voltage follower,
the control unit simultaneously opens all switches selected from a group consisting of all the third switches and all of both the first and third switches to hold the electric charge in the first capacitors.

* * * * *